(12) United States Patent
Cyrusian

(10) Patent No.: US 7,737,776 B1
(45) Date of Patent: Jun. 15, 2010

(54) POWER EFFICIENT AMPLIFIER

(75) Inventor: Sasan Cyrusian, Scotts Valley, CA (US)

(73) Assignee: Marvell International Ltd. (BM)

( * ) Notice: Subject to any disclaimer, the term of this patent is extended or adjusted under 35 U.S.C. 154(b) by 0 days.

(21) Appl. No.: 12/350,735

(22) Filed: Jan. 8, 2009

Related U.S. Application Data

(63) Continuation of application No. 11/786,886, filed on Apr. 12, 2007, now Pat. No. 7,492,219.

(60) Provisional application No. 60/822,009, filed on Aug. 10, 2006.

(51) Int. Cl.
*H03F 3/38* (2006.01)

(52) U.S. Cl. .................... 330/10; 330/207 A; 330/75

(58) Field of Classification Search ............... 330/10, 330/207 A, 75
See application file for complete search history.

(56) References Cited

U.S. PATENT DOCUMENTS

| | | | |
|---|---|---|---|
| 6,211,728 B1 | 4/2001 | Chen et al. | |
| 6,518,838 B1 | 2/2003 | Risbo | |
| 6,594,309 B1 | 7/2003 | Botti et al. | |
| 6,614,297 B2 | 9/2003 | Score et al. | |
| 6,847,257 B2 | 1/2005 | Edwards et al. | |
| 6,922,100 B2 | 7/2005 | Midya et al. | |
| 7,135,922 B2 | 11/2006 | Zepp | |
| 7,262,658 B2 | 8/2007 | Ramaswamy et al. | |
| 7,286,008 B2 | 10/2007 | Watts | |
| 7,312,654 B2 | 12/2007 | Roechner et al. | |
| 7,317,349 B2 * | 1/2008 | Morishima | 330/10 |
| 7,339,425 B2 | 3/2008 | Yang | |
| 7,378,904 B2 * | 5/2008 | Risbo | 330/10 |
| 7,414,471 B2 * | 8/2008 | Krishnan et al. | 330/251 |
| 7,498,876 B2 * | 3/2009 | Peruzzi et al. | 330/10 |

OTHER PUBLICATIONS

Nielsen, K., "PEDEC—A Novel Pulse Referenced Control Method for High Quality Digital PWM Switching Power Amplification", *IEE*, 1998, pp. 200-207.

\* cited by examiner

*Primary Examiner*—Patricia Nguyen

(57) ABSTRACT

An amplifier generates a tri-level output signal in response to an input signal that is pulse-width modulated. The amplifier is filterless and DC free. A control block supplies a multitude of pulse-width modulated (PWM) signals in response to the received digital input signal. A pair of the PWM signals are applied to the signal generator which in response supplies a third signal to the integrator. The integrator integrates the third signal in accordance with a feedback signal.

28 Claims, 16 Drawing Sheets

US 7,737,776 B1

POWER EFFICIENT AMPLIFIER

CROSS-REFERENCES TO RELATED APPLICATIONS

This application is a continuation of copending application Ser. No. 11/786,886, filed Apr. 12, 2007, which is hereby incorporated by reference in its entirety, claims benefit under 35 USC §119(e) of U.S. provisional application No. 60/822,009, filed on Aug. 10, 2006, entitled "Power Efficient Amplifier", also incorporated herein by reference in its entirety.

BACKGROUND OF THE INVENTION

The present application relates to amplifiers, and more particularly to amplifiers that have a reduced power consumption.

Audio amplifiers are well known and are used extensively to amplify audio signals. Designing an audio amplifier generally requires balancing two competing concerns. The first concern is fidelity which relates to the accuracy with which the audio amplifier reproduces the sounds contained in the audio signal. The second concern is power efficiency, which relates to the power consumption of the audio amplifier under various operating conditions.

FIG. 1 is a block diagram of an audio amplifier 10, as known in the prior art. Digital-to-analog converter (DAC) 12 converts the digital audio signal $D_{dig}$ to an analog audio signal. The converted audio signal is applied to a class AB amplifier 14. The amplified audio signal is applied to speaker 16 via AC coupling capacitor 18. As is well known, amplifier 14 has a relatively low efficiency, thus rendering this amplifier undesirable for handheld portable devices which often have a limited battery life and/or internal cooling capacity.

FIG. 2 is a functional block diagram of a conventional analog class D audio amplifier 20. Class D audio amplifier 20 is generally more efficient than class AB amplifier 14 shown in FIG. 1. The fidelity of class D audio amplifier 20 can be comparable to that of Class AB audio amplifier 14 depending on variables such as switching frequency, thermal noise of resistors 24 and 50, noise of amplifier 28, noise and distortion of signal generator 36, noise of comparator 34, the loop delay and the blanking time of driver 40.

DAC 12 converts the digital audio signal $D_{dig}$ to an analog audio signal which is subsequently amplified by operational amplifier (opamp) 22. Opamp 22 supplies the amplified audio signal to integrator 26 via resistive load 24. Integrator 26 includes an opamp 28 and a feedback capacitor 30. The output signal of integrator 26 is supplied to one of the input terminals of comparator 34. The other input terminal of comparator 34 receives a sawtooth or triangular waveform generated by sawtooth/triangular waveform generator 36. Comparator 34 and sawtooth/triangular waveform generator 36 together form a natural frequency sampling module 32 that generates a pulse-width modulated (PWM) signal. The frequency of the sawtooth/triangular waveform is usually at least 10 times higher than the maximum audible frequency included in the analog audio signal.

Logic and pre-driver 38 converts the received PWM signal into signals suitable for use by driver 40. In some embodiments, driver 40 is single-ended and includes a switch, such as a transistor and the like, that switches power to low-pass filter 44. Such a switch is opened and closed based on the signals received from logic and pre-driver 38. The output signal of driver 40 is applied to low pass filter 44 and is also fed back to integrator 26 via resistor 50. Low-pass filter 44 removes the switching harmonics form the signal it receives via driver 40. Low-pass filter 44 is shown as including an inductor 46 and a capacitor 48. Signal OUT generated by driver 40 is delivered to speaker 16.

FIG. 3 is a block diagram of driver 40 coupled to low-pass filter 44 and speaker 46. Switches 52 and 54 are controlled by signals POS and NEG received from logic and pre-driver 38. To apply a positive pulse to speaker 16, switch 52 is turned on and switch is turned off. To apply a negative pulse to speaker 16, switch 54 is turned on and switch 52 is turned off. Inductor 46 together with capacitor 48 form a low-pass filter that attenuate the high frequency signal components. An AC coupling capacitor 82 can be connected in series with speaker 16 to eliminate a direct current (DC) component of the signal applied to speaker 16.

FIG. 4 is a timing diagram of the input signals received and output signal generated by comparator 34. Sinusoidal signal 62 represents the input signal received from integrator 26. Sawtooth signal 64 represents the signal generated by waveform generator 36. Signal 66 represents the output signal of comparator 34 and is a pulse-width modulated (PWM) signal. The duty cycle of PWM signal 66 is determined by the amount of time that the magnitude of signal 62 is greater than the magnitude of signal 64. The period of PWM signal 66 is determined by the period of signal 64.

BRIEF SUMMARY OF THE INVENTION

In accordance with one embodiment of the present invention, an amplifier includes, in part, a control block adapted to generate first and second pulse-width modulated (PWM) control signals in response to a digital input signal, a signal generator adapted to generate a third signal in response to the first and second PWM control signals, an integrator adapted to integrate the third signal in accordance with a feedback signal, and a comparator adapted to generate a comparison signal. The comparison signal has a first logic state if the integrator's output signal is greater than a reference signal and a second logic state if the integrator's output signal is smaller than the reference signal.

In one embodiment, the control block generates a third PWM signal that is delayed with respect to the first PWM signal and a fourth PWM signal that is delayed with respect to the second PWM. The amplifier also includes, in part, a switch logic adapted to receive the third and fourth PWM signals and the comparison signal and to generate first, second and third driver control signals in response. In one embodiment, the first driver control signal is applied to a first transistor disposed in the driver, the second driver control signal is applied to a second transistor disposed in the driver, and the third driver control signal is applied to a third transistor disposed in the driver. The first transistor is adapted to deliver a first voltage to the driver's output node, the second transistor is adapted to deliver a second voltage to the driver's output node, and the third transistor is adapted to deliver a third voltage to the driver's output node. In one embodiment, the first voltage is a positive supply voltage, the second voltage is a negative supply voltage and the third voltage is the ground voltage.

In one embodiment, the digital input signal is an audio signal and the output signal of the driver is applied to a speaker or a headphone. In another embodiment, the output signal of the drive is applied to a low-pass filter. In one embodiment, the digital audio data is compliant with Inter-IC Sound (I2S) specification. In another embodiment, the digital input signal is a digital video signal.

In one embodiment, the signal generator further includes, in part, a first voltage divider coupled between the first and second supply voltages, a first operational amplifier responsive to the voltage divider, a first switch adapted to deliver the output voltage of the first operational amplifier as the third signal in response to the first PWM signal, a second voltage divider coupled between a third supply voltage and the second supply voltages, a second operational amplifier responsive to the voltage divider, and a second switch adapted to deliver an output voltage of the second operational as the third signal in response to the second PWM signal. In another embodiment, the signal generator further includes, in part, a first current source supplying a first current, a first switch adapted to deliver the first current as the third signal, a second current source supplying a second current, and a second switch adapted to deliver the second current as the third signal.

In one embodiment, the control block includes, in part, an upsampler adapted to upconvert a sampling rate of the digital input signal, a sampling point module adapted to determine cross sections of a sawtooth or a triangular signal with the upconverted digital input signal, the cross sections defining a first binary word, a noise shaper adapted to receive the first binary word and generate a second binary word having fewer bits than the first binary word, and a pulse-width modulator adapted to generate the first, second, third and forth PWM signals.

In one embodiment, the pulse-width modulator further includes, in part, circuitry adapted to increase the width of each of the first, second, third and forth PWM signals by a minimum amount. In another embodiment, the pulse-width modulator further includes, in part, circuitry adapted to increase a width of a pulses it generates by a minimum amount if the width of that pulse is less than a predefined value. In some embodiments, the switch logic generates a pulse in response to a rising and/or falling edge of the comparison signal it receives.

In accordance with one embodiment of the present invention, a method of amplifying a signal includes, in part, generating first and second pulse-width modulated (PWM) control signals in response to a digital input signal, generating a third signal in response to the first and second PWM control signals, integrating the third signal in accordance with a feedback signal, and generating a comparison signal having a first logic state if the integrated signal is greater than a reference signal and a second logic state if the integrated signal is smaller than the reference signal.

In some embodiments, the method further includes, in part, generating a third PWM signal that is delayed with respect to the first PWM signal, generating a fourth PWM signal that is delayed with respect to the second PWM signal, and generating first, second and third driver control signals in response the third and fourth PWM signals and the comparison signal. In some embodiments, the method further includes delivering a first voltage to an output node in response to the first driver control signal, delivering a second voltage to the output node in response to the second driver control signal, and delivering a third voltage to the output node in response to the third driver control signal. In one embodiment, the first voltage is a positive supply voltage, the second voltage is a negative supply voltage and the third voltage is the ground voltage.

In one embodiment, the method further includes setting the third signal to a voltage defined by the levels of the first and second supply voltages in response to the first PWM signal, and setting the third signal to a voltage defined by the levels of the third and second supply voltages in response to the second PWM signal. In one embodiment, the method further includes delivering a first current as the third signal in response to the first PWM signal, and delivering a second current as the third signal in response to the second PWM signal.

In one embodiment, the method further includes upconverting the sampling rate of the digital input signal, determining cross sections of a sawtooth or a triangular signal with the upconverted digital input signal with the cross sections defining a first binary word, noise shaping the first binary word to generate a second binary word having fewer bits than the first binary word. In some embodiment, the method further includes increasing a width of one or more of the PWM signal by a minimum amount if the width of the width of the one or more of the PWM signals is detected as being smaller than a predefined value. In one embodiment, the method further includes generating a pulse in response to a falling and/or rising edge of the comparison signal.

In accordance with one embodiment of the present invention, an amplifier includes, in part, means for generating first and second pulse-width modulated (PWM) control signals in response to a digital input signal, means for generating a third signal in response to the first and second PWM control signals, means for integrating the third signal in accordance with a feedback signal, and means for generating a comparison signal having a first logic state if the integrated signal is greater than a reference signal and a second logic state if the integrated signal is smaller than the reference signal.

In some embodiments, the amplifier further includes, in part, means for generating a third PWM signal that is delayed with respect to the first PWM signal, means for generating a fourth PWM signal that is delayed with respect to the second PWM signal, and means for generating first, second and third driver control signals in response the third and fourth PWM signals and the comparison signal. In some embodiments, the amplifier further includes means for delivering a first voltage to an output node in response to the first driver control signal, means for delivering a second voltage to the output node in response to the second driver control signal, and means for delivering a third voltage to the output node in response to the third driver control signal. In one embodiment, the first voltage is a positive supply voltage, the second voltage is a negative supply voltage and the third voltage is the ground voltage.

In one embodiment, the digital input signal is an audio signal and the output signal of the driver is applied to a speaker or a headphone. In another embodiment, the output signal of the drive is applied to a low-pass filter. In one embodiment, the digital audio data is compliant with Inter-IC Sound (I2S) specification. In another embodiment, the digital input signal is a digital video signal.

In one embodiment, the amplifier further includes means for setting the third signal to a voltage defined by the levels of the first and second supply voltages in response to the first PWM signal, and means for setting the third signal to a voltage defined by the levels of the third and second supply voltages in response to the second PWM signal. In one embodiment, the amplifier further includes means for delivering a first current as the third signal in response to the first PWM signal, and means for delivering a second current as the third signal in response to the second PWM signal.

In one embodiment, the amplifier further includes means for upconverting the sampling rate of the digital input signal, means for determining cross sections of a sawtooth or a triangular signal with the upconverted digital input signal with the cross sections defining a first binary word, means for noise shaping the first binary word to generate a second binary word having fewer bits than the first binary word. In some embodiment, the amplifier further includes means for increasing a width of one or more of the PWM signal by a minimum amount if the width of the width of the one or more of the PWM signals is detected as being smaller than a predefined value. In one embodiment, the amplifier further includes means for generating a pulse in response to a falling and/or rising edge of the comparison signal.

DETAILED DESCRIPTION OF THE INVENTION

An amplifier, in accordance with one embodiment of the present invention, generates a tri-level output signal in response to a digital input signal. The amplifier is filterless and DC free. The amplifier includes, in part, an integrator, a signal generator, a comparator, a switch pulse logic, a driver, and a control block. The control block supplies a multitude of pulse-width modulated (PWM) signals in response to the received digital input signal. A pair of the PWM signals are applied to the signal generator which in response supplies a signal to the integrator. The integrator's output signal is compared to a reference signal by the comparator. The switch pulse logic receives the output of the comparator and a pair of delayed PWM signals, and in response generates a multitude of driver signals applied to the driver. In response, the driver supplies an output signal that is adapted to vary between first, second and third voltages. In one embodiment, the third voltage may be the ground voltage.

Figure 1:
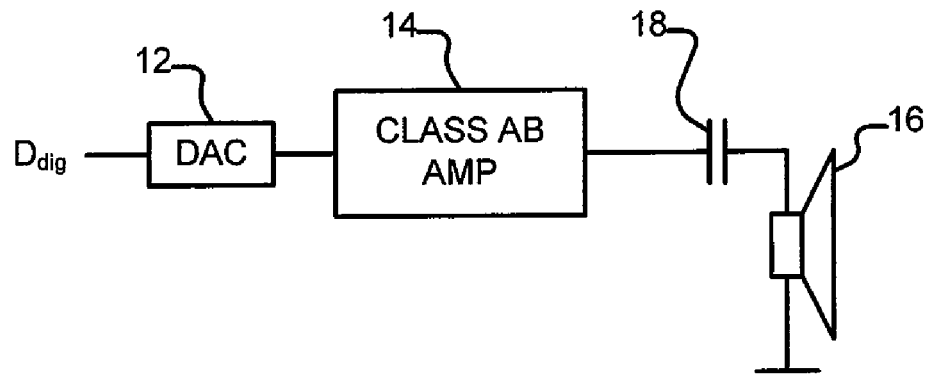
FIG. 1 is a functional block diagram of a Class AB amplifier, as known in the prior art.
Figure 3:
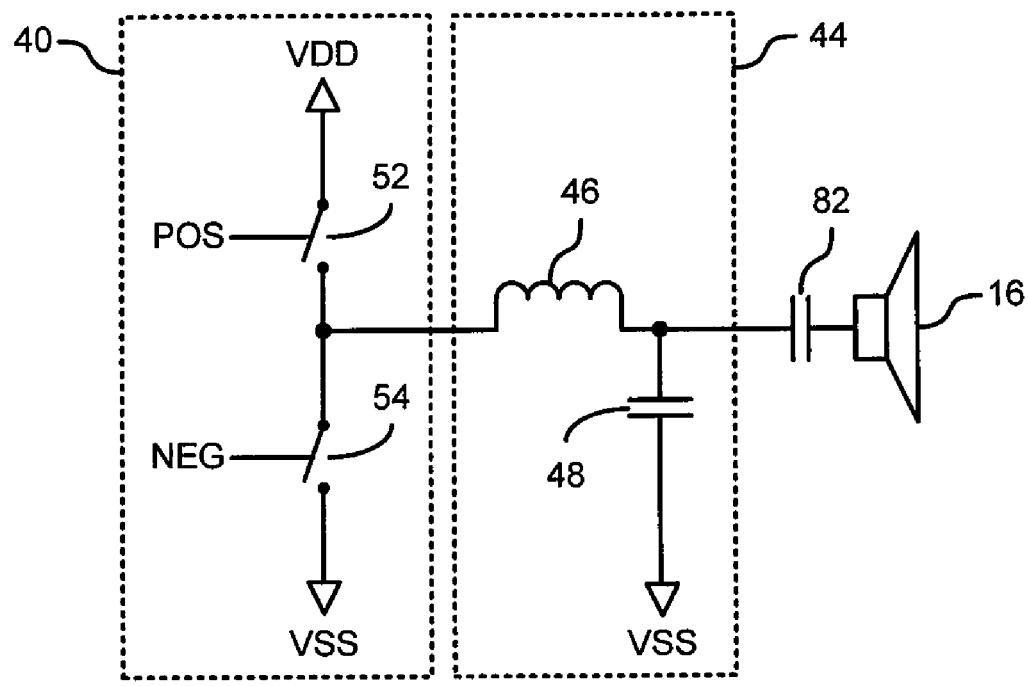
FIG. 3 is a schematic diagram of the driver disposed in the amplifier of FIG. 2, as known in the prior art.
Figure 2:
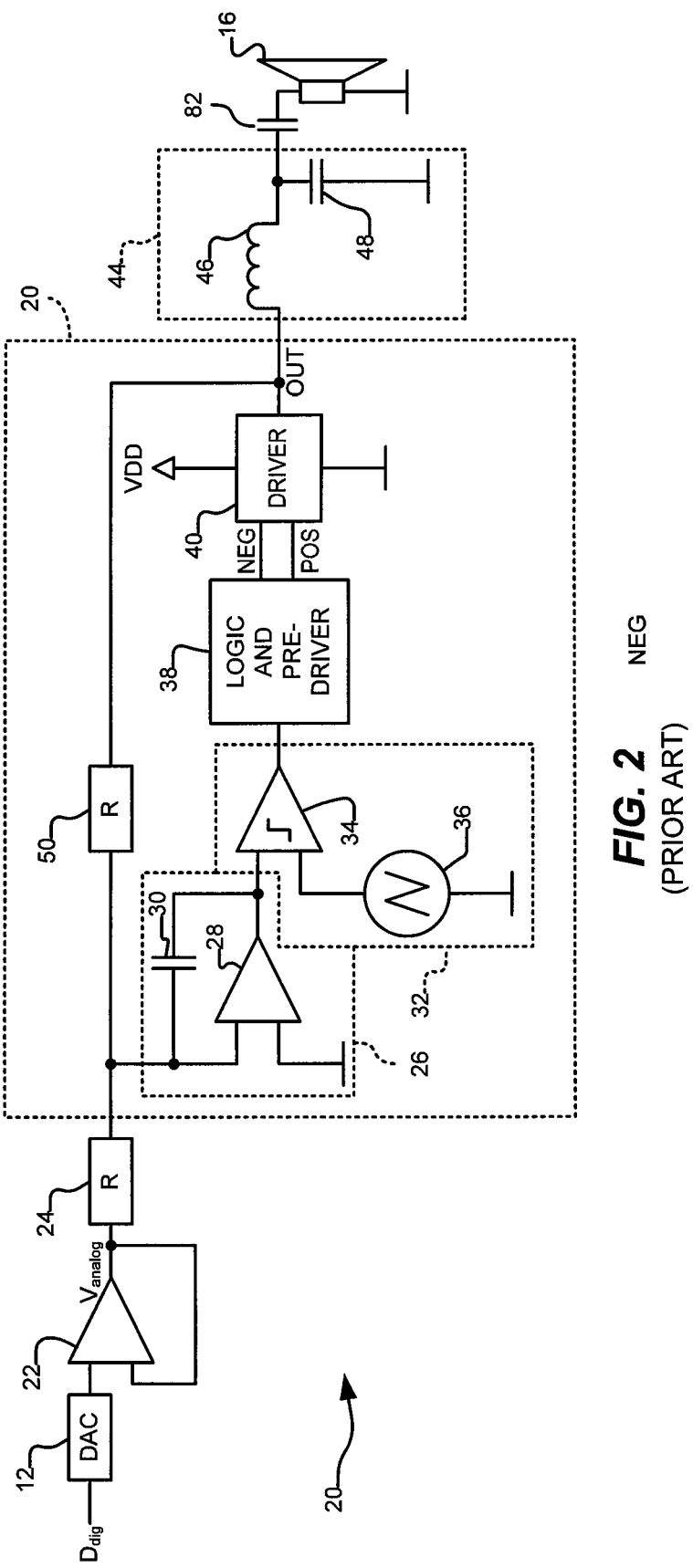
FIG. 2 is a functional block diagram of a Class D amplifier, as known in the prior art.
Figure 4:
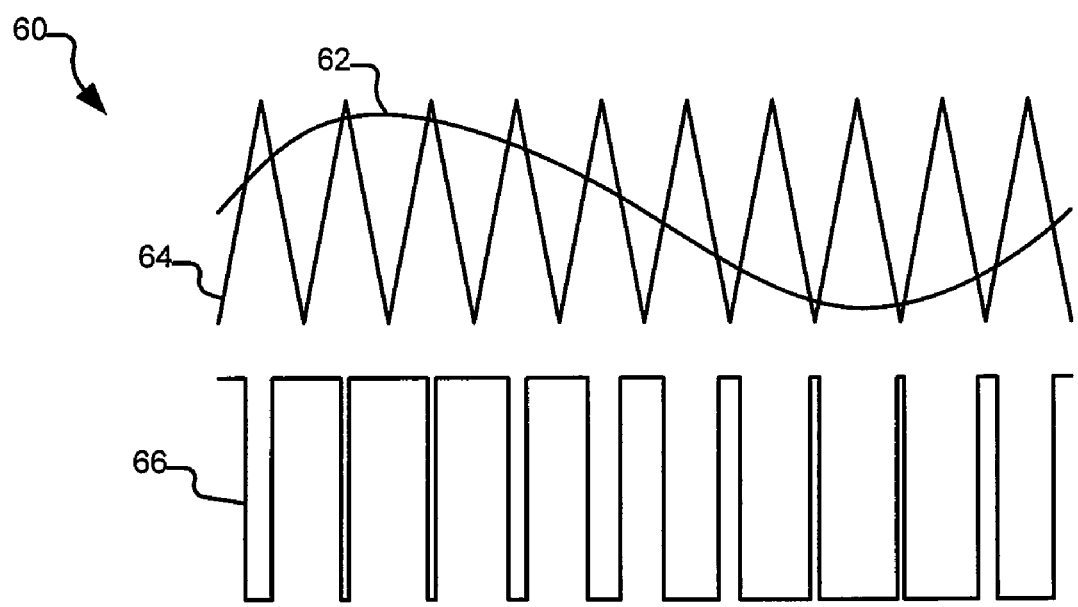
FIG. 4 is timing diagram of the input/output signals of the comparator disposed in the amplifier of FIG. 2, as known in the prior art.
Figure 5:
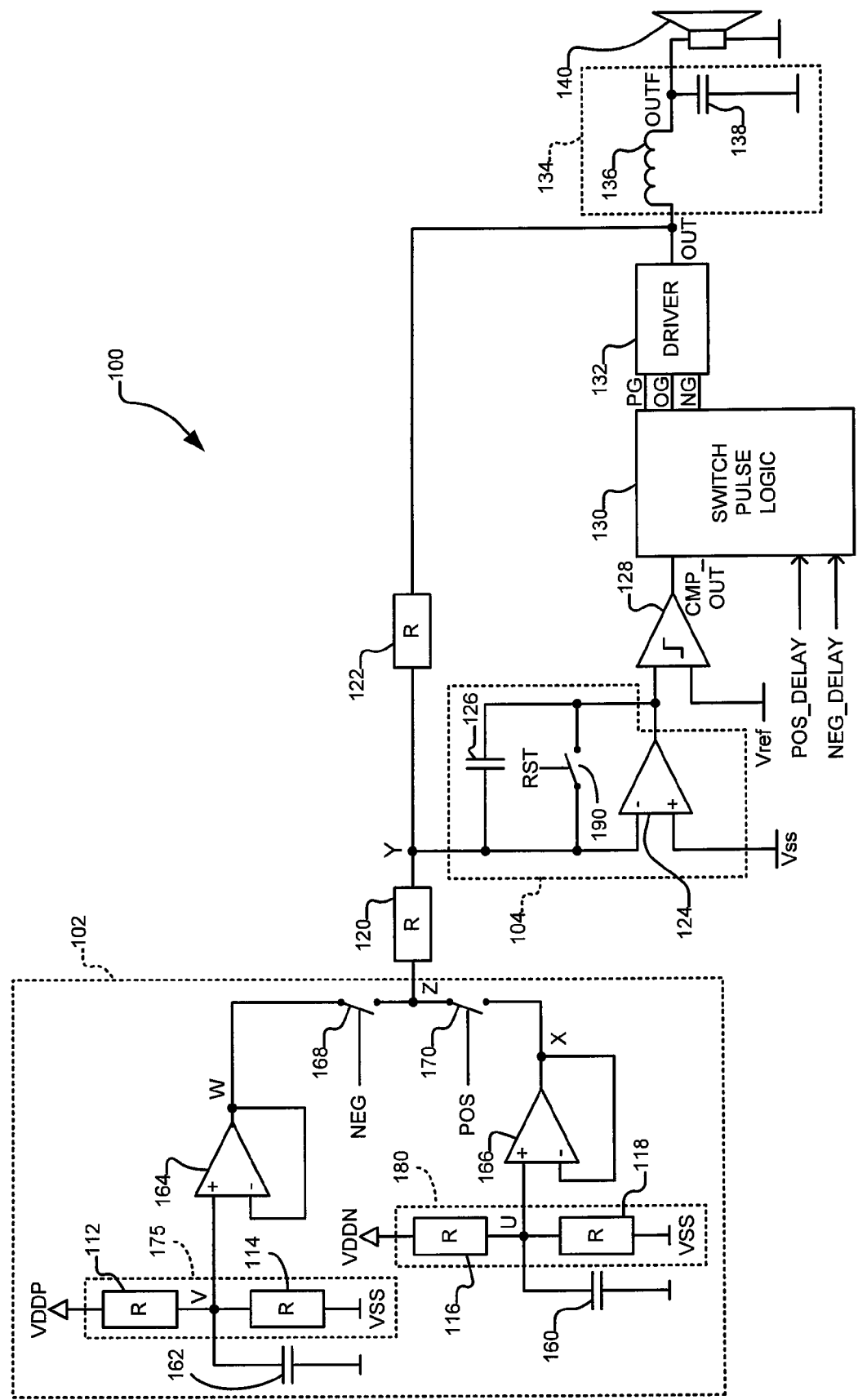
FIG. 5 is a functional block diagram of an amplifier, in accordance with one embodiment of the present invention.

FIG. 5 is a block diagram of an amplifier 100 that provides a tri-level output signal, in accordance with one embodiment of the present invention. The following description is provided with reference to using amplifier 100 in audio applications. It is understood, however, that amplifier 100 may also be used in many other applications, such as in processing video information, etc.

Signal generator, also referred to herein as signal source, 102 is shown as including voltage dividers 175, 180, capacitors 160, 162, operational amplifiers 164, 166 and switches 168 and 170. In response to signals POS and NEG applied to switches 168 and 170, current is either sourced to or drawn from output node Z of signal source 102. In some embodiments, switches 168 and 170 may be transistor switches.

Voltage divider 175 includes resistive loads 112 and 114 that are disposed between positive supply voltage VDDP and a reference voltage Vss. Reference voltage Vss may be the ground voltage. The inverting input of operational amplifier (op-amp) 164 is coupled to its output. Op-amp 164 generates a voltage at node W that is maintained substantially at the same potential as that at node V. Capacitor 162 attenuates the high frequency components of noise present at node V. Voltage divider 180 includes resistive loads 116 and 118 that are disposed between negative supply voltage VDDN and the reference voltage Vss. The inverting input of op-amp 166 is coupled to its output. Op-amp 166 generates a voltage at node X that is maintained substantially at the same potential as that at node U. Capacitor 160 attenuates the high frequency components of any noise present at node U. In some embodiments the feedback path between the input and output terminals of op-amps 164 and 166 may include a resistor or a compensation network. When signal NEG is asserted, signal POS is deasserted, accordingly the voltage at node W is supplied to node Z. Conversely, when signal POS is asserted, signal NEG is deasserted, accordingly the voltage at node X is supplied to node Z. The signal supplied to node Z by signal source 102 has a substantially attenuated noise component.

Figure 6:
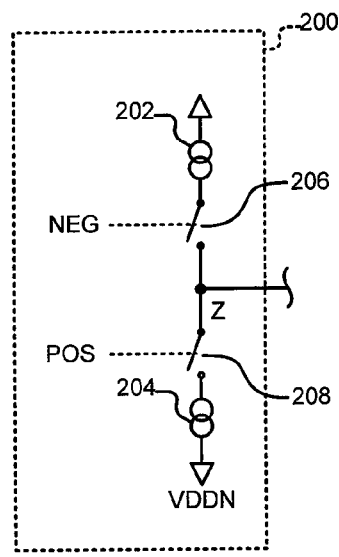
FIG. 6 is a functional block diagram of an exemplary signal generator adapted to supply a signal to the amplifier of FIG. 5, in accordance with one embodiment of the present invention.

FIG. 6 is a schematic diagram of another exemplary embodiment 200 of a signal source that may be used in place of signal source 102 and resistor 120 of FIG. 5. Signal source 200 is shown as including current sources 202, 204 and switches 206, 208. Switch 206 that receives signal NEG is disposed between current source 202 and node Y, shown in FIG. 5. Similarly, switch 208 that receives signal POS is disposed between current source 204 and node Y. When signal NEG is asserted, the current supplied by current source 202 flows to node Y. When signal POS is asserted, the current supplied by current source 204 flows to node Y.

Figure 7:
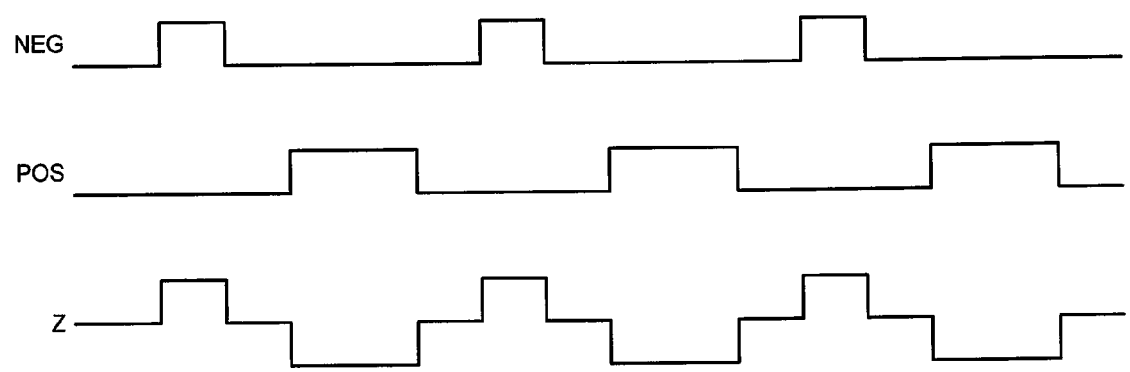
FIG. 7 is a timing diagram of a number of signals associated with the amplifier of FIG. 5, in accordance with one embodiment of the present invention.

FIG. 7 is a timing diagram of voltage signals POS, NEG as well as the voltage signal supplied to node Z. Referring to FIGS. 6 and 7 concurrently, when signal POS is at a high level, the voltage at node Z corresponds to the voltage at node X, and when signal NEG is at a high level, the voltage at node Z corresponds to the voltage at node W. When signals POS and NEG are both at zero levels, signal Z is also at the reference voltage Vss, e.g., zero volts. In one embodiment, supply voltages VDDP and VDDN are respectively at +1.5 volts and −1.5 volts. Accordingly, in such embodiments, the voltage at node Z varies between zero volts and a fraction of ±1.5 volts.

Referring to FIG. 5, the signal present at node Z is delivered to an input terminal of op-amp 124 via resistor 120. The other input terminal of op-amp 124 is coupled to a reference voltage $V_{ss}$, that may or may not be the ground potential. Feedback capacitor 126, disposed between input and output terminals of op-amp 124, is discharged when signal RST applied to switch 190 is asserted. Op-amp 124 together with capacitor 126 form an integrator 104. Op-amp 124 may be powered by supply voltages VDDP and VDDN.

The output signal of integrator 104 is applied to a first terminal of comparator 128 whose other terminal receives reference voltage Vref. In some embodiments, voltage Vref may be the ground potential. If the voltage supplied by integrator 104 is greater than reference voltage Vref, the output signal of comparator 128 is set to a high level, and if the voltage supplied by integrator 104 is smaller than reference voltage Vref, the output signal of comparator 128 is set to a low level. Comparator 128 may be powered by supply voltages VDDP and VDDN.

Switch pulse logic 130 receives the output signal of comparator 128 as well as the pulse-width modulated (PWM) signals POS_DELAY and NEG_DELAY, and in response generates control signals NG, PG and OG that are applied to driver 132. Driver 132 generates a tri-level output signal OUT in response to control signals NG, PG and OG that it receives. In one embodiment, such as that shown in FIG. 5, signal OUT is applied to a low pass filter 134, shown as including an inductor 136 and a capacitor 138. It is understood, however, that other low-pass filters may be used. The filtered output signal OUTF is applied to speaker 140. Signal OUT is fed back to the inverting terminal of op-amp 124 via resistive load 122. In some embodiments (not shown), an inductor and a capacitor internal to speaker 140 is used to filter out signal OUT. Accordingly in such embodiments, signal OUT is applied to directly to speaker 140 or a headphone. Amplifier 100 is filterless. Furthermore, since the DC level of the voltage signal supplied by amplifier 100 does not need to be shifted with respect to a reference DC voltage, amplifier 100 is DC free. In other words, to deliver, for example, 1.5 volts, the output voltage of amplifier 100 is set to 1.5 volts and not to another DC voltage level.

Figure 8:
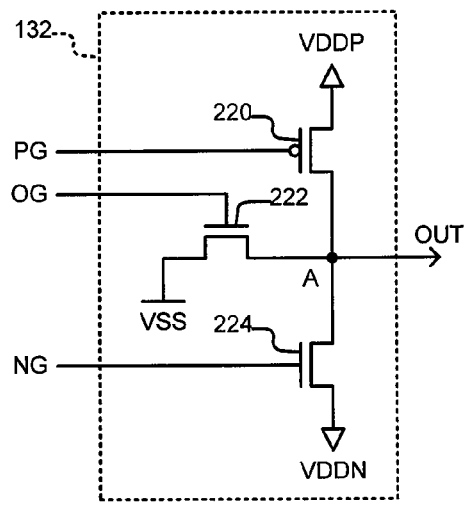
FIG. 8 is a schematic diagram of an exemplary driver disposed in the amplifier of FIG. 5, in accordance with one embodiment of the present invention.

FIG. 8 is a transistor schematic diagram of an exemplary embodiment of driver 132. Driver 132 is shown as including transistors 220, 222 and 224 that respectively receive signals PG, OG and NG at their gate terminals. When signal PG is at a low level, signals NG and OG are at a high level. Accordingly, PMOS transistor 220 is on and NMOS transistor 222 and 224 are off. Therefore, node A is pulled to the positive supply voltage VDDP. When signals PG and NG are at a high level, signal OG is at a low level. Accordingly, transistor 224 is on and transistors 220 and 222 are off. Therefore, node A is pulled to the negative supply voltage VDDN. When signal PG is at a high level and signal NG is at a low level, signal OG is at a high level. Therefore, node A is pulled to the supply voltage Vss. Consequently, driver 132 is adapted to vary the voltage at node A between supply voltages VDDP, VDDN and Vss. In other words, driver module 132 generates a tri-level output signal by only turning on one of the transistors 220, 222 and 224 at any given time.

The feedback loop from the output of driver 132 to the input of op-amp 124 provides a number of advantages. First, the feedback loop attempts to compensate for the finite switch resistance at output node A of driver 132. Ideally, the switch resistance seen by node A should be as small as possible, e.g., 0 ohms, to enable node A to pulled to supply voltages VDDP, VDDN and Vss as closely as possible. Second, the feedback loop compensates for the voltage overshoot and undershoot at node A during blanking times, as described further below. To prevent current flow from the positive voltage supply to the negative voltage supply, any of the transistors 220, 222 and 224 that is on during one cycle is first turned off before another one of these transistors is turned on during the next cycle. The time period between turning off of a transistor and turning on of another transistor in an output driver is referred to as the blanking time.

Referring to FIGS. 5 and 8 concurrently, when, for example, transistor 220 is turned off, the current flow through the inductive load 136 seen by node A does not change instantaneously. This causes the voltage at node A to increase, causing a supply overshoot. The overshoot causes the source-to-bulk diode of transistor 220 to turn on. Once this diode is turned on, the voltage at node A is clamped at one PN junction diode above the VDDP voltage. Similarly, a voltage undershoot can occur during switching of transistor 224. As described above, the feedback loop compensates for the supply voltage overshoot and undershoot at output node A. Third, the feedback loop helps achieve power supply rejection. In other words, the feedback loop rejects variations in the voltage at node A that may arise due to variations in supply voltages VDPP and VDDN.

Figure 9:
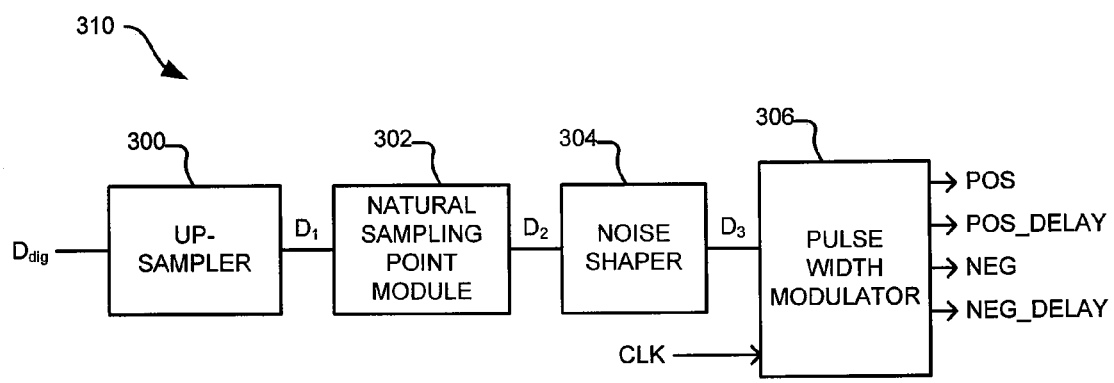
FIG. 9 is a diagram of exemplary logic blocks used to control the amplifier of FIG. 5, in accordance with one embodiment of the present invention.

FIG. 9 shows various components of a control block 310 adapted to control amplifier 100 of FIG. 5. In response to the digital audio signal $D_{dig}$, control block 310 generates signals POS, NEG, POS_DELAY and NEG_DELAY that are applied to amplifier 100 shown in FIG. 5. In some embodiments, the audio signal $D_{dig}$ is compliant with an $I^2S$ (Inter-IC Sound) bus specification published by Philips Corporation; this specification is hereby incorporated by reference in its entirety. In some embodiments, the audio signal $D_{dig}$ may include audio samples between about 8 KHz and 192 KHz.

Up-sampler 300 upconverts the sampling rate of signal $D_{dig}$. In one embodiment, signal $D_{dig}$ has a sampling rate of, for example, 48 KHz and signal $D_1$ supplied by up-sampler 300 has a sampling rate of, for example, 384 KHz. Natural sampling point module 302 identifies the cross sections of a sawtooth/triangular signal and the up-sampled signal D1 to generate a digitized word $D_2$. In one embodiment, $D_2$ is, for example, a 20-bit word and thus a clock signal of, for example, 400 GHz clock would be required to process the, e.g., 20-bit word $D_2$.

To dispense the need for such a high frequency clock, e.g., a 400 GHz clock, signal $D_2$ is applied to noise shaper 304 which enables pulse-width modulator 306 to use a slower clock, e.g., a 480 MHz clock. Noise shaper 304 performs a bit-reduction algorithm and spreads the quantization error around so that more of the error is focused on higher inaudible frequencies. The result is that where human ear is most sensitive, the quantization error is reduced, and where human ear is less sensitive, the noise is greater. In one embodiment noise shaper 304, reduces the number of bits in signal $D_2$ from, e.g., 20 bits to generate signal $D_3$ that has, e.g., 8-bits. Some embodiments of the present invention do not include a noise shaper. In such embodiments, the output signal $D_2$ of natural sampling module 302 is applied directly to pulse-width modulator 306.

Figure 10:
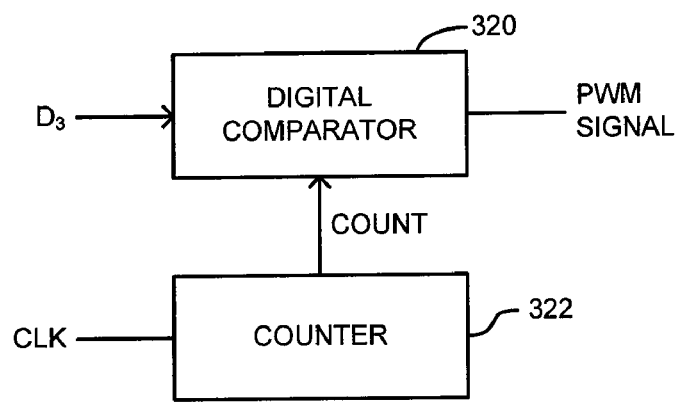
FIG. 10 is a block diagram of a number of components adapted to generate a pulse-width modulated signal.
Figure 11:
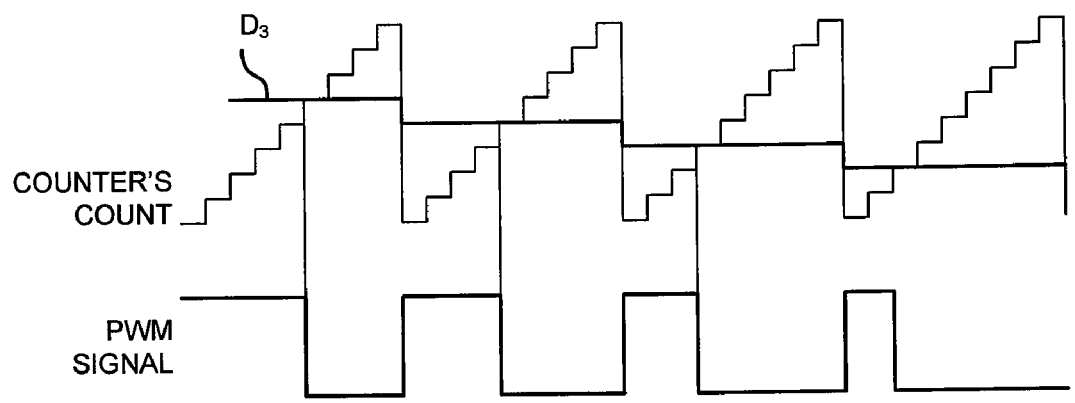
FIG. 11 is an exemplary timing diagram of the signals associated with the pulse-width modulator of FIG. 10.

Pulse width modulator 306 includes one or more counters and one or more digital comparators that generate pulse-width modulated signals POS, NEG, POS_DELAY and NEG_DELAY. FIG. 10 is a block diagram of a counter 322 coupled to a digital comparator 320 adapted to generate a pulse-width modulated signal. Counter 322 increments its count with each transition of clock signal CLK. The count of counter 322 establishes the comparison value of comparator 320. When signal $D_3$ is greater than the counter's count, comparator 320 generates a logic high signal, and when signal $D_3$ is smaller than the counter's count, comparator 320 generates a logic low signal. Accordingly, the width of the pulses generated by comparator 320 is modulated in accordance with signal $D_3$ and the counter's count. FIG. 11 is an exemplary timing diagram of the counter 320's count, signal $D_3$ and the resulting pulse-width modulated signal.

Signal POS_DELAY has a phase delay with respect to signal POS. In some embodiment, the delay between phases of signals POS and POS_DELAY is fixed. In other embodiments, the delay between phases of signals POS and POS_DELAY is programmable and thus may be varied. Similarly, signal NEG_DELAY has a phase delay with respect to signal NEG. In some embodiment, the delay between phases of signals NEG and NEG_DELAY is fixed. In other embodiments, the delay between phases of signals NEG and NEG_DELAY is programmable and thus may be varied.

A pulse with a width that is less than a threshold value may not be properly transferred. Accordingly, in some embodiments, the width of each pulse generated by pulse width modulator 306 is increased by a predefined minimum width. In yet other embodiments, only the widths of pulses that are less than a previously established threshold value are increased by a predefined minimum width. The width added to a pulse is subsequently removed during the next pulse. In accordance with the present invention, the minimum width is added at the center of the sawtooth signal, such as the digitized sawtooth signal shown in FIG. 11. In other words, the place where the minimum width is added is independent of the value of signal $D_3$. Similarly, the minimum width added to each pulse is also independent of the pulse that it is added to. In other words, the width added to each pulse is also independent of the value of signal $D_3$. When the signal sign changes from positive to negative, the sign of the minimum width also flips from positive to negative. By adding the minimum pulse width to each pulse or to pulses satisfying a predefined condition, it is guaranteed that all the pulses are transferred properly.

Figure 12A:
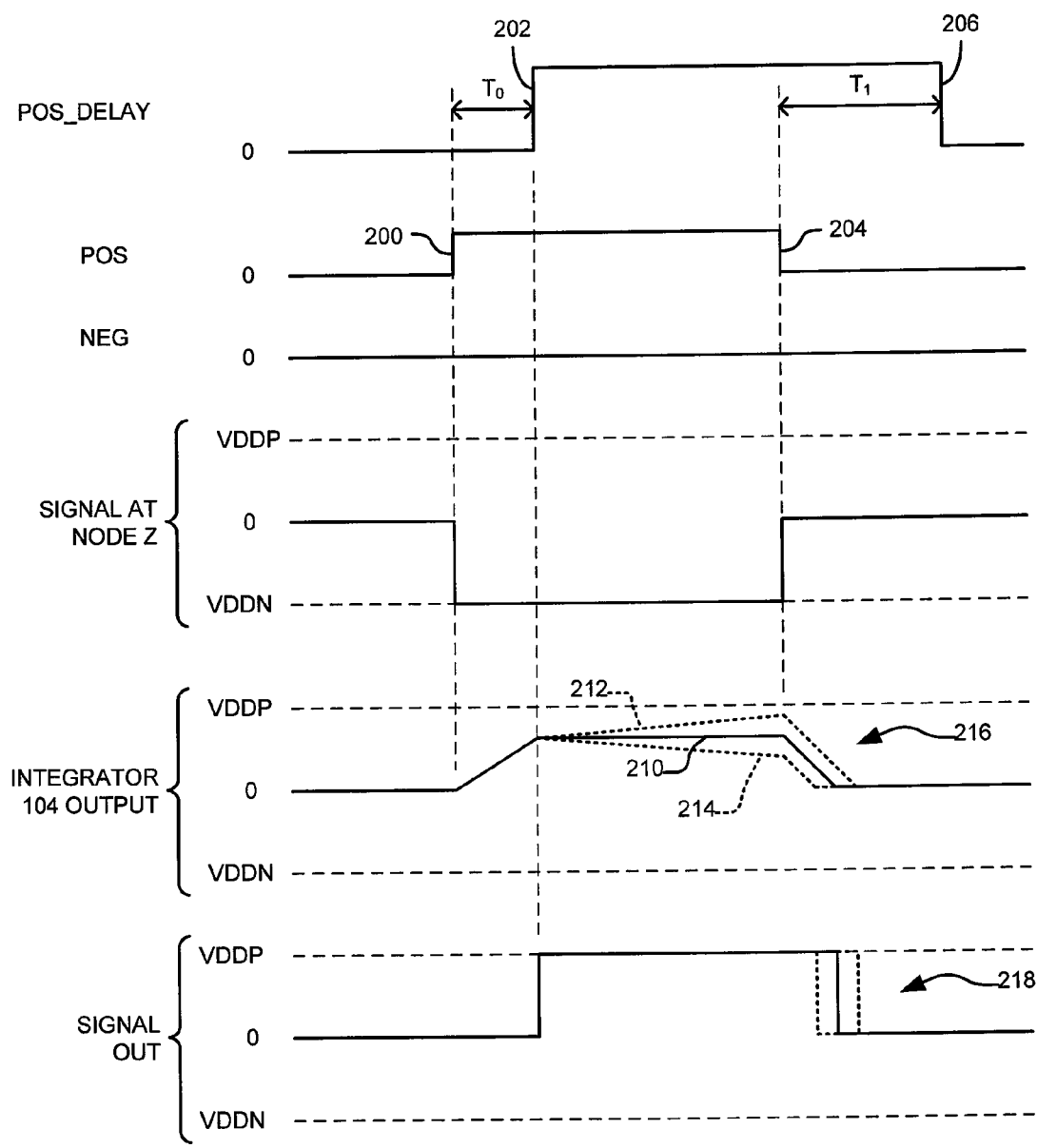
FIGS. 12A-12B are exemplary timing diagrams of a number of signals associated with the amplifier of FIG. 5.

FIG. 12A is a timing diagram example of a number of signals associated with amplifier 100, shown in FIG. 5. In accordance with this timing diagram, a positive pulse from 0 to VDDP is generated by output driver 132, i.e., signal OUT. The process of generating the positive pulse begins at time 200. At time 200, pulse width modulator 306 causes signal POS signal to go high, thereby causing switch 170 to close. Signal NEG remains low to keep switch 168 open. The width (duration) of pulse signal POS is determined based on data $D_3$ received from noise shaper 304, as described above. After the elapse of time period $T_0$, pulse width modulator 306 causes signal POS_DELAY to make a low-to-high transition at time 202. During the period $T_0$, the output voltage of driver 132 is at the ground potential, therefore, integrator 104 integrates only the signal it receives from signal source 102 and its output increases during this time. Because signal POS is at a high level during this time, the voltage supplied to integrator 104 via node Z is supplied by voltage divider 180 and op-amp 166.

When signal POS_DELAY makes a low-to-high transition at time 202, signals PG, NG and OG go low. This causes transistor 220 to turn on and transistors 222 and 224 to be off, in turn causing output signal OUT carried by node A to be pulled to VDDP. The high voltage at node A is applied to integrator 104 via feedback resistor 122. From time 202, when signals POS_DELAY makes a low-to-high transition, until time 204, when signal POS makes a high-to-low transition, integrator 104 integrates the difference between the signals supplied by signal source 102 at node Z, and the signal received from feedback resistor 122. If this difference is zero, the output of integrator 104 remains generally flat as shown at 210. If this difference is positive, the output of integrator 104 increases as shown at 212. If this difference is negative, the output of integrator 104 decreases as shown at 214.

Pulse width modulator 306 returns signals POS and POS_DELAY to zero at times 204 and 206, respectively. In some embodiment, the delay $T_1$—between the times 206 and 204—is twice the delay $T_0$—between the times 202 and 200. In some embodiments, delays $T_0$ and $T_1$ are fractions of the width of signal POS. Time delays $T_0$ and $T_1$ provide integrator 104 with sufficient time to integrate and discharge, respectively, without causing comparator 128 to generate a multitude of signal transitions, or to go into saturation. Saturation refers to a condition according to which the integrator's output tries either to reach or exceed the maximum possible output voltage or to reach or go below a minimum possible output voltage.

At time 204 the output of integrator 104 begins to fall at decay rate 216. The duration of the decay depends on the level of the integrator 104 output voltage signal at time 204. At time 218 the output signal from integrator 104 is assumed to cross the constant reference signal of comparator 128. The output of comparator 128 thus switches, in turn causing signal OUT generated by driver 132 to be lowered from VDDP to the ground potential. Occurrence of time 218 is dependent on the level of output signal of integrator 104 at time 204 and decay rate 216. Integrator 104 therefore adjusts the duration of signal OUT to accommodate for fluctuations in the supply voltages VDDP, VDDN, the voltage drops across transistor switches 220 and 224 of driver 132, and overshoots and undershoots of signal OUT. Integrator 104 therefore adjusts the duration of signal OUT such that the area covered by signal OUT is approximately constant for a given $D_3$ received from noise shaper 176.

Figure 12B:
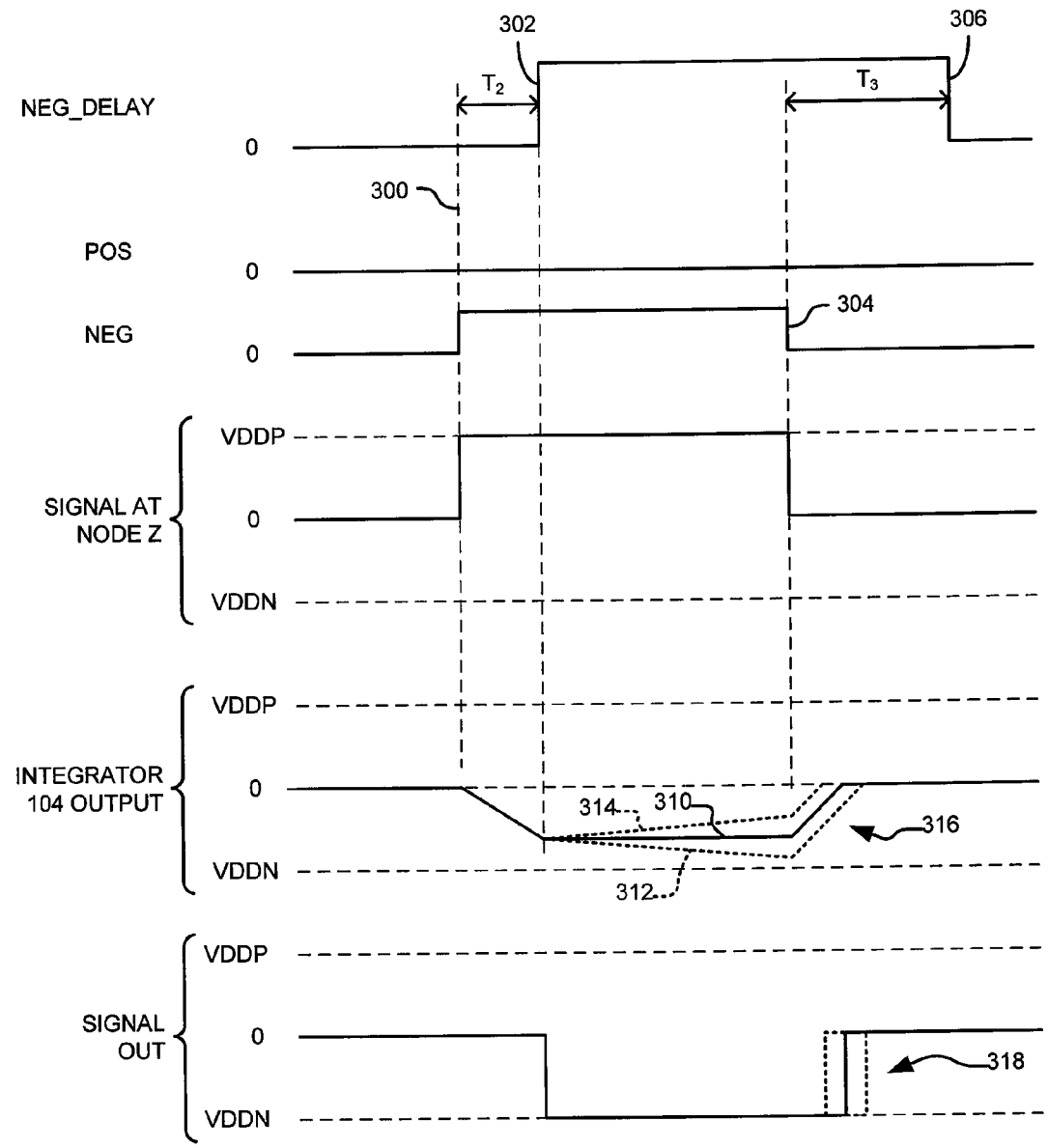

FIG. 12B is an exemplary timing diagram of a number of signals associated with amplifier 100, shown in FIG. 5. In accordance with this timing diagram, a negative pulse from 0 to VDDN is generated by output driver 132. The process of generating the negative pulse begins at time 300. At time 300, pulse-width modulator 306 causes signal NEG to go high, thereby causing switch 168 to close. Signal POS remains low to keep switch 170 open. The width (duration) of pulse signal NEG is determined based on data $D_3$ received from noise shaper 304, as described above. After an elapse of time period $T_2$, pulse-width modulator 306 causes signal NEG_DELAY to make a low-to-high transition at time 302. During the period $T_2$, the output voltage of driver 132 is at the ground potential, therefore, integrator 104 integrates only the signal it receives from signal source 102, therefore its output voltage decreased during this time. Because signal NEG is at a high level during this time, the voltage supplied to integrator 104 via node Z is supplied by voltage divider 175 and op-amp 164.

When signal NEG_DELAY makes a low-to-high transition at time 302, signal OG goes low and signal NG goes high. This causes transistor 222 to turn off and transistor 224 to turn on, in turn causing output signal OUT carried by node A to be pulled low to negative supply voltage VDDN. The voltage VDDN at node A is applied to integrator 104 via feedback resistor 122. From time 302, when signals NEG_DELAY makes a low-to-high transition, until time 304, when signal NEG makes a high-to-low transition, integrator 104 integrates the difference between the signals supplied by signal source 102 at node Z, and the signal received from feedback resistor 122. If this difference is zero, the output of integrator 104 remains generally flat as shown at 210. If this difference is positive, the output of integrator 104 decreases as shown at 312. If this difference is negative, the output of integrator 104 decreases as shown at 314.

Pulse width modulator 306 returns signals NEG and NEG_DELAY to zero at times 304 and 306, respectively. In some embodiment, the delay $T_3$—between the times 306 and 304—is twice the delay $T_2$—between the times 302 and 300. In some embodiments, delays $T_2$ and $T_3$ are fractions of the width of signal NEG. Time delays $T_2$ and $T_3$ provide integrator 104 with sufficient time to integrate and discharge, respectively, without causing comparator 128 to generate a multitude of signal transitions.

At time 304 the output of integrator 104 begins to rise at a decay rate 316. The duration of the rise depends on the level of the integrator 104 output voltage signal at time 304. At time 318 the output signal from integrator 104 is assumed to cross the constant reference signal of comparator 128. The output of comparator 128 thus switches, in turn causing signal OUT generated by driver 132 to be raise from VDDN to the ground potential. Occurrence of time 318 is dependent on the level of output signal of integrator 104 at time 304 and decay rate 316. Integrator 104 therefore adjusts the duration of signal OUT to accommodate for fluctuations in the supply voltages VDDP, VDDN, and the voltage drops across transistor switches 220 and 224 of driver 132. Integrator 104 therefore adjusts the duration of signal OUT such that the area covered by the duration of signal OUT is approximately constant for a given signal $D_3$ received from noise shaper 176.

Figure 13A:
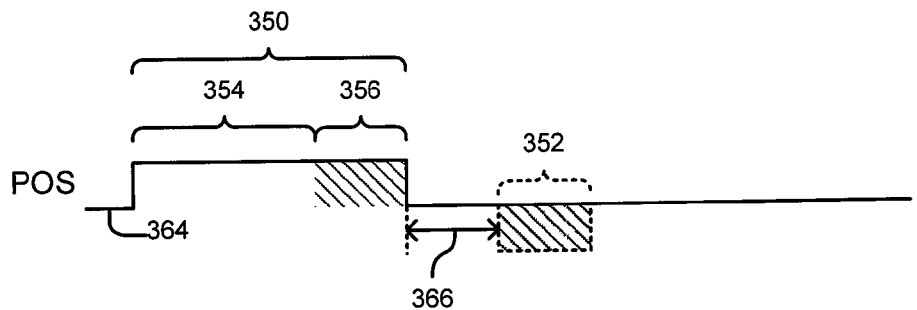
FIGS. 13A-13C are exemplary transitions of the signals generated by the pulse-width modulator of FIG. 9.

FIG. 13A shows an exemplary transition of output signal POS generated by pulse width modulator 306. The transition period 350 includes the added positive pulse width 356 followed by a counteracting negative pulse width 352 that is the same as the added positive pulse width 356. The counteracting minimum-width positive and negative pulses are added and subtracted by PWM module 306 to all signals POS, POS_DELAY, NEG and NEG_DELAY, although only that of signal POS is shown. The added minimum pulse width 356 ensures that switch pulse logic 130 and driver 132 have enough time to switch when clock signal CLK received by PWM module 306 operates at a relatively high frequency.

Figure 13B:
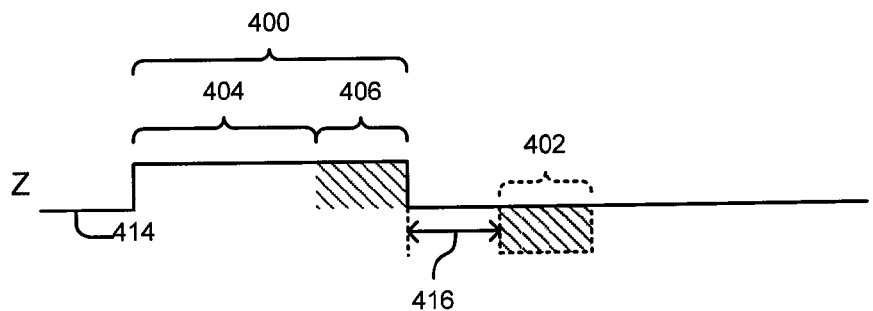

FIG. 13B shows an exemplary transition from 0 volt to VDDP at output node Z of signal source 102 (see FIG. 5). The transition period 400 includes the positive pulse width 400 followed by a counteracting negative pulse width 402 that is the same as the added positive pulse width 406. The counteracting minimum-width positive and negative pulses are added and subtracted by PWM module 306 to signals POS, POS_DELAY, NEG and NEG_DELAY, and are subsequently transferred to node Z. The added positive pulse width 406 ensures that switch pulse logic 130 and driver 132 have enough time to switch completely when clock signal CLK received by PWM module 306 operates at a relatively high frequency.

Figure 13C:
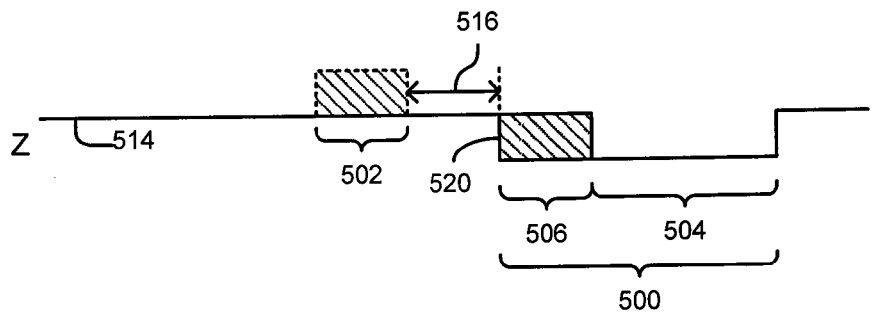

FIG. 13C shows an exemplary transition from 0 volt to VDDN at output node Z of signal source 102. Knowing in advance that a negative minimum pulse width 506 will be added, a counteracting positive minimum pulse width is added during the period 502. As described above, the added minimum pulse width 506 ensures that switch pulse logic 130 and driver 132 have enough time to switch completely when clock signal CLK received by PWM module 306 operates at a relatively high frequency.

Figure 14A:
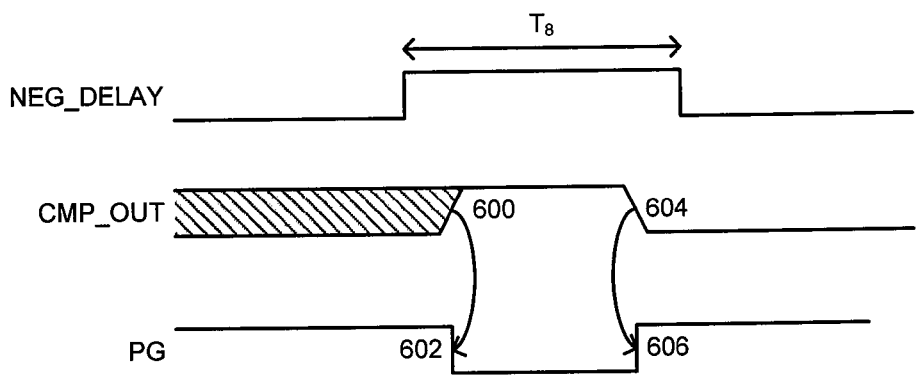
FIGS. 14A-14B are exemplary timing diagrams of a number of signals associated with the switch pulse logic of the amplifier of FIG. 5.
Figure 14B:
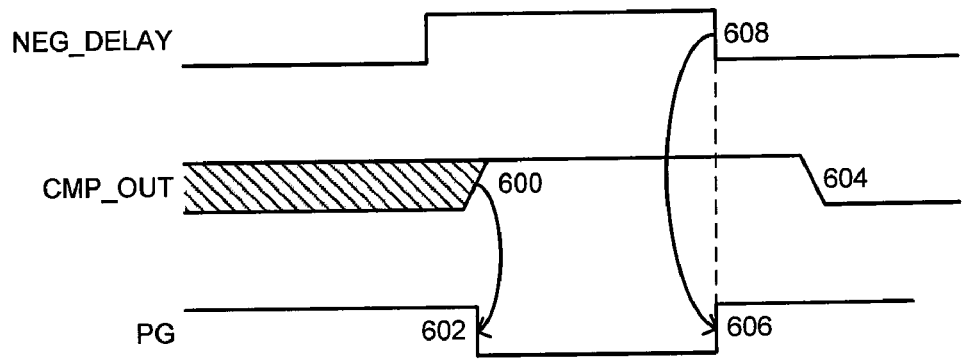

FIGS. 14A and 14B show exemplary timing relationship between signal NEG_DELAY, the output signal of comparator 128, CMP_OUT, and signal PG applied to the gate terminal of transistor 220 disposed in driver 132. During a predefined period $T_8$ while signal NEG_DELAY remains asserted, in response to a low-to-high transition 600 of signal CMP_OUT, signal PG is asserted, e.g., makes a high-to-low transition 602. Signal PG remains asserted until one of two conditions is satisfied. First, referring to FIG. 14A, signal PG is deasserted—shown using transition 606—if signal CMP_OUT makes a high-to-low transition 604 during the period $T_8$. When signal CMP_OUT makes such a high-to-low transition, a pulse generated within switch pulse logic 130 deasserts signal PG. Second, referring to FIG. 14B, if a high-to-low transition on signal CMP_OUT does not occur during period $T_8$, signal PG remains asserted until signal NEG_DELAY makes a high-to-low transition 608, in response to which signal PG is deasserted—shown using transition 606.

Figure 15A:
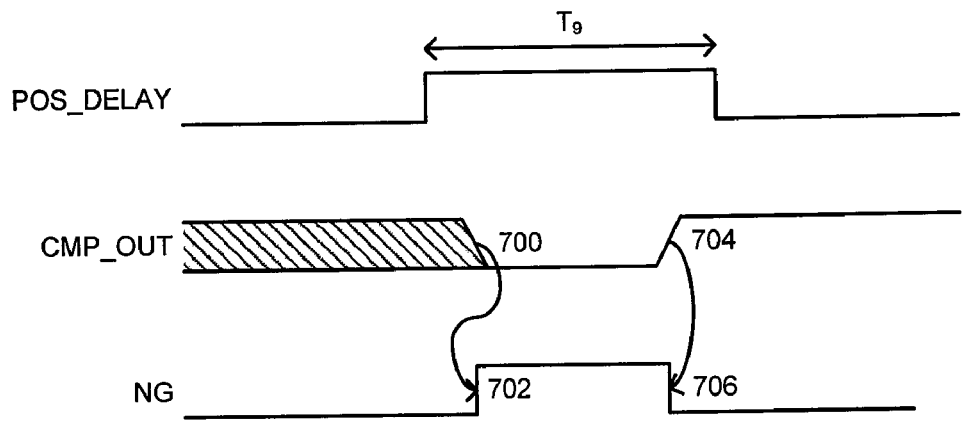
FIGS. 15A-15B are exemplary timing diagrams of a number of signals associated with the switch pulse logic of the amplifier of FIG. 5.
Figure 15B:
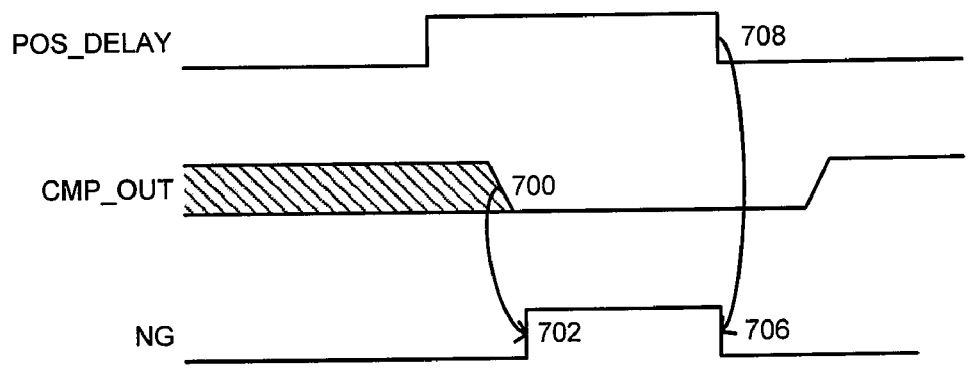

FIGS. 15A and 15B show exemplary timing relationship between signal NEG_DELAY, the output signal of comparator 128, CMP_OUT, and signal NG applied to the gate terminal of transistor 224 disposed in driver 132. During a predefined period $T_9$ while signal NEG_DELAY remains asserted, in response to a high-to-low transition 700 of signal CMP_OUT, signal NG is asserted, e.g., makes a low-to-high transition 702. Signal NG remains asserted until one of two conditions is satisfied. First, referring to FIG. 14B, signal NG is deasserted—shown using transition 706—if signal CMP_OUT makes a high-to-low transition 704 during period $T_9$. When signal CMP_OUT makes such a low-to-high transition, a pulse generated within switch pulse logic 130 deasserts signal NG. Second, referring to FIG. 15B, if a low-to-high transition on signal CMP_OUT does not occur during period $T_9$, signal NG remains asserted until signal NEG_DELAY makes a high-to-low transition 708, in response to which signal NG is deasserted—shown using transition 706.

Figure 16:
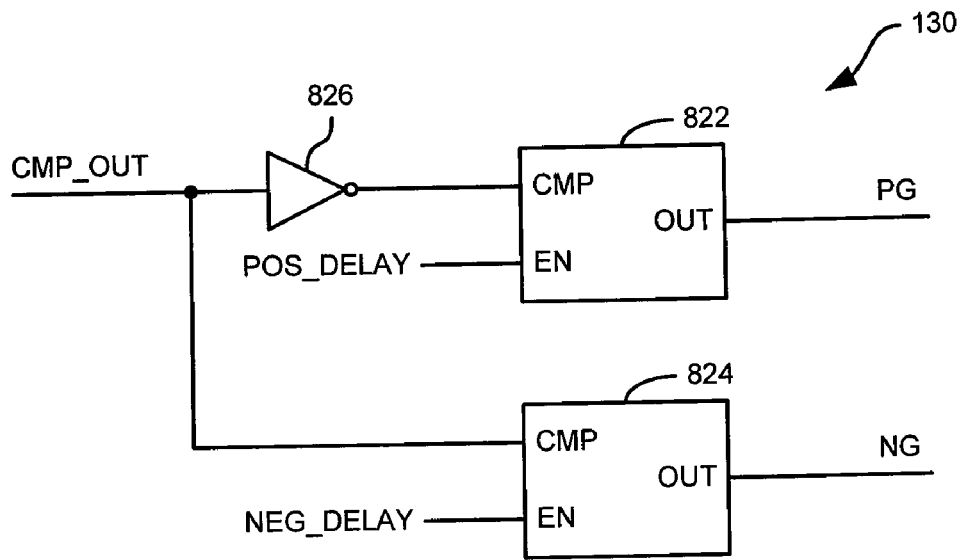
FIG. 16 is a logic block diagram of the switch pulse logic disposed in the amplifier of FIG. 5, in accordance with one embodiment of the present invention.

FIG. 16 is a block diagram of switch pulse logic 130. Switch pulse logic 130 is shown as including a pair of one-shot logic blocks 822, 824 and inverter 826. Signal CMP_OUT generated by comparator 128 is applied to the input terminal CMP of one-shot block 824. Inverter 826 applies the inverse of signal CMP_OUT to the input terminal CMP of one-shot block 822. Signals POS_DELAY and NEG_DELAY are applied to the input terminal EN of one-shot logic blocks 822 and 824 respectively. One-shot logic blocks 822 and 824 are adapted to suppress spikes that may appear on signal CMP_OUT. Furthermore, the pulse width of the signal CMP_OUT is increased by a minimum predefined value if it is detected by the one-shot logic blocks 822 and 824 to be shorter than a pre-established value.

Figure 17:
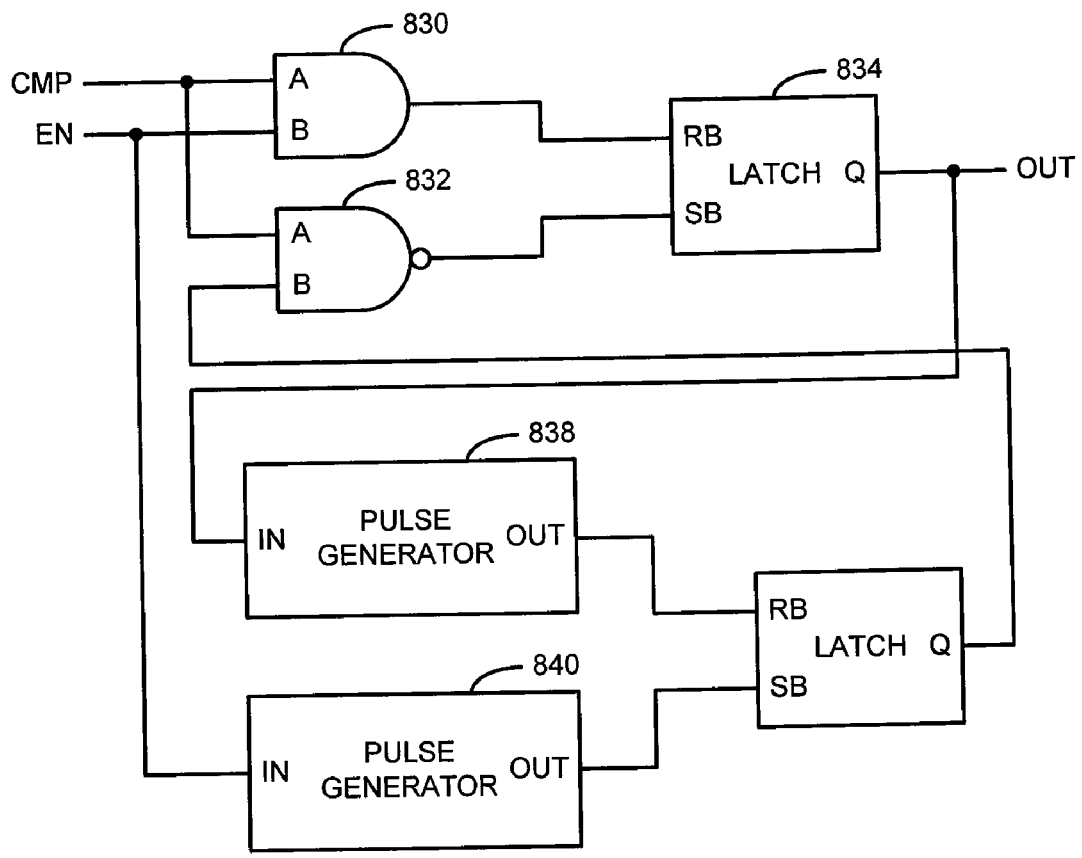
FIG. 17 shows a number of logic blocks disposed in the switch pulse logic of FIG. 16, in accordance with one embodiment of the present invention.

FIG. 17 shows the various components of each of one-shot logic blocks 822 and 824, in accordance with one embodiment of the present invention. Each of these one-shot logic blocks is shown as including an AND gate 830, a NAND gate 832, set-reset latches 834, 836, and pulse generators 838 and 840. Signal Q of each of latches 834 and 836 is set to 1 if the input signal SB of that latch is set to zero. Similarly, signal Q of each of latches 834 and 836 is set to zero if the input signal RB of that latch is set to zero. Each of pulse generators 838 and 840 generates a one-shot pulse of a predefined duration when it receives a transition on its input signal IN.

Figure 18A:
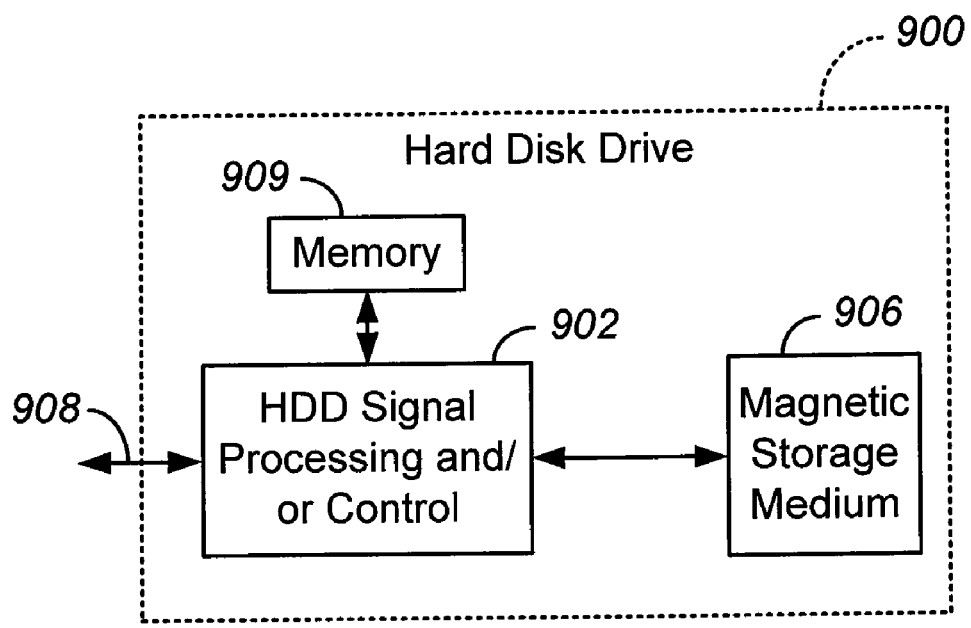
FIGS. 18A-18H show various devices in which the present invention may be embodied.

Referring now to FIGS. 18A-18G, various exemplary implementations of the present invention are shown. Referring to FIG. 18A, the present invention may be embodied in a hard disk drive 900. The present invention may implement either or both signal processing and/or control circuits, which are generally identified in FIG. 18A at 902. In some implementations, signal processing and/or control circuit 902 and/or other circuits (not shown) in HDD 900 may process data, perform coding and/or encryption, perform calculations, and/or format data that is output to and/or received from a magnetic storage medium 906.

HDD 900 may communicate with a host device (not shown) such as a computer, mobile computing devices such as personal digital assistants, cellular phones, media or MP3 players and the like, and/or other devices via one or more wired or wireless communication links 908. HDD 900 may be connected to memory 909, such as random access memory (RAM), a low latency nonvolatile memory such as flash memory, read only memory (ROM) and/or other suitable electronic data storage.

Figure 18B:
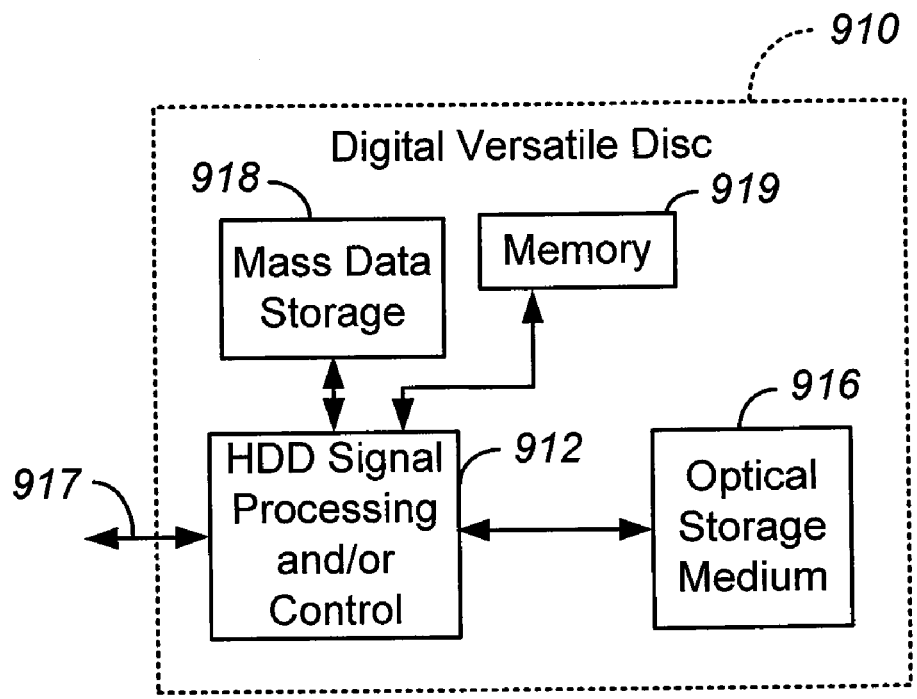

Referring now to FIG. 18B, the present invention may be embodied in a digital versatile disc (DVD) drive 910. The present invention may implement either or both signal processing and/or control circuits, which are generally identified in FIG. 18B at 912, and/or mass data storage 918 of DVD drive 910. Signal processing and/or control circuit 912 and/or other circuits (not shown) in DVD 910 may process data, perform coding and/or encryption, perform calculations, and/or format data that is read from and/or data written to an optical storage medium 916. In some implementations, signal processing and/or control circuit 912 and/or other circuits (not shown) in DVD 910 can also perform other functions such as encoding and/or decoding and/or any other signal processing functions associated with a DVD drive.

DVD drive 910 may communicate with an output device (not shown) such as a computer, television or other device via one or more wired or wireless communication links 917. DVD 910 may communicate with mass data storage 918 that stores data in a nonvolatile manner. Mass data storage 918 may include a hard disk drive (HDD) such as that shown in FIG. 18A. The HDD may be a mini HDD that includes one or more platters having a diameter that is smaller than approximately 1.8". DVD 910 may be connected to memory 919, such as RAM, ROM, low latency nonvolatile memory such as flash memory, and/or other suitable electronic data storage.

Figure 18C:
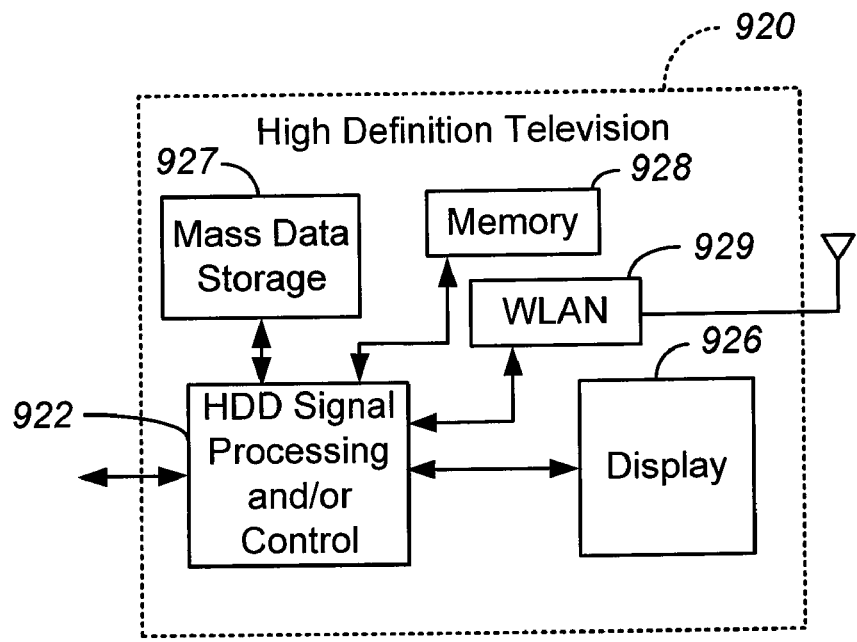

Referring now to FIG. 18C, the present invention may be embodied in a high definition television (HDTV) 920. The present invention may implement either or both signal processing and/or control circuits, which are generally identified in FIG. 18C at 922, a WLAN interface and/or mass data storage of the HDTV 920. HDTV 920 receives HDTV input signals in either a wired or wireless format and generates HDTV output signals for a display 926. In some implementations, signal processing circuit and/or control circuit 922 and/or other circuits (not shown) of HDTV 920 may process data, perform coding and/or encryption, perform calculations, format data and/or perform any other type of HDTV processing that may be required.

HDTV 920 may communicate with mass data storage 927 that stores data in a nonvolatile manner such as optical and/or magnetic storage devices. At least one HDD may have the configuration shown in FIG. 18A and/or at least one DVD may have the configuration shown in FIG. 18B. The HDD may be a mini HDD that includes one or more platters having a diameter that is smaller than approximately 1.8". HDTV 920 may be connected to memory 928 such as RAM, ROM, low latency nonvolatile memory such as flash memory and/or other suitable electronic data storage. HDTV 920 also may support connections with a WLAN via a WLAN network interface 929.

Figure 18D:
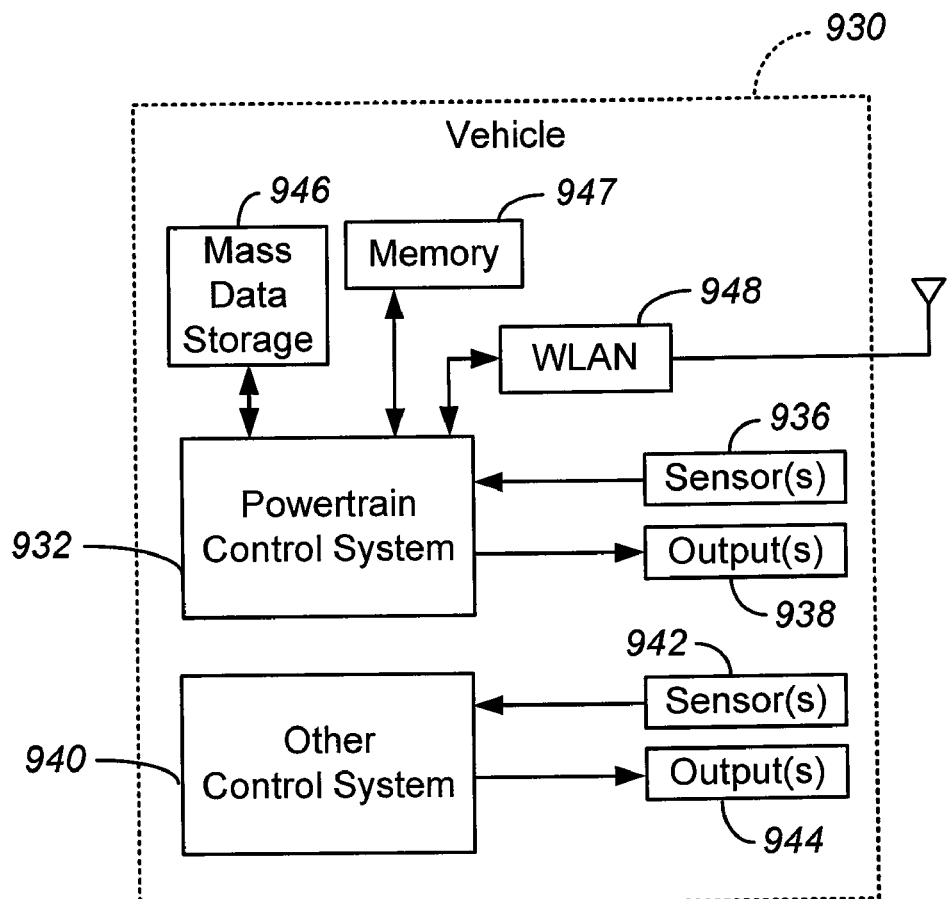

Referring now to FIG. 18D, the present invention implements a control system of a vehicle 930, a WLAN interface and/or mass data storage of the vehicle control system. In some implementations, the present invention implements a powertrain control system 932 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The present invention may also be embodied in other control systems 940 of vehicle 930. Control system 940 may likewise receive signals from input sensors 942 and/or output control signals to one or more output devices 944. In some implementations, control system 940 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

Powertrain control system 932 may communicate with mass data storage 946 that stores data in a nonvolatile manner. Mass data storage 946 may include optical and/or magnetic storage devices for example hard disk drives HDD and/or DVDs. At least one HDD may have the configuration shown in FIG. 18A and/or at least one DVD may have the configuration shown in FIG. 18B. The HDD may be a mini HDD that includes one or more platters having a diameter that is smaller than approximately 1.8". Powertrain control system 932 may be connected to memory 947 such as RAM, ROM, low latency nonvolatile memory such as flash memory and/or other suitable electronic data storage. Powertrain control system 932 also may support connections with a WLAN via a WLAN network interface 948. The control system 940 may also include mass data storage, memory and/or a WLAN interface (all not shown).

Figure 18E:
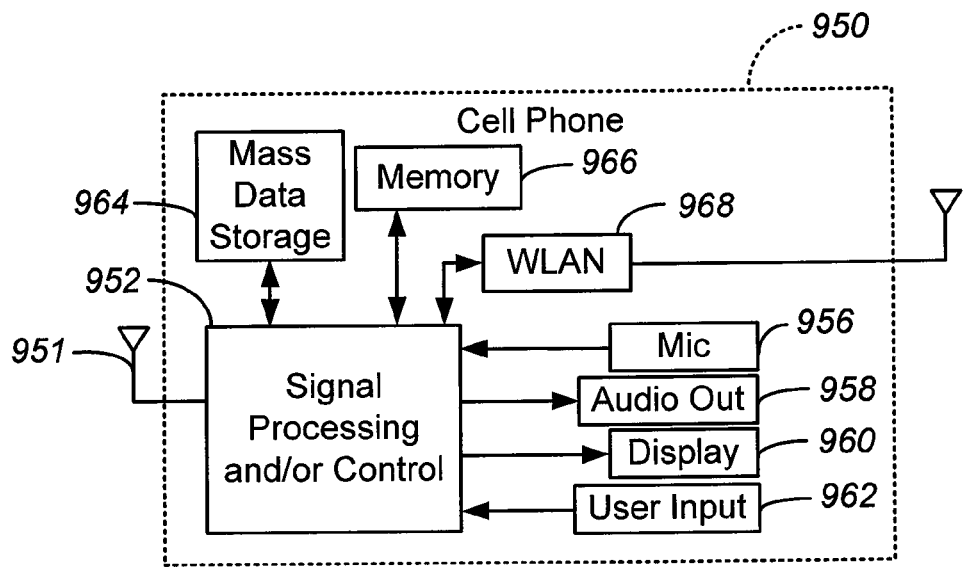

Referring now to FIG. 18E, the present invention may be embodied in a cellular phone 950 that may include a cellular antenna 951. The present invention may implement either or both signal processing and/or control circuits, which are generally identified in FIG. 18E at 952, a WLAN interface and/or mass data storage of the cellular phone 950. In some implementations, cellular phone 950 includes a microphone 956, an audio output 958 such as a speaker and/or audio output jack, a display 960 and/or an input device 962 such as a keypad, pointing device, voice actuation and/or other input device. Signal processing and/or control circuits 952 and/or other circuits (not shown) in cellular phone 950 may process data, perform coding and/or encryption, perform calculations, format data and/or perform other cellular phone functions.

Cellular phone 950 may communicate with mass data storage 964 that stores data in a nonvolatile manner such as optical and/or magnetic storage devices for example hard disk drives HDD and/or DVDs. At least one HDD may have the configuration shown in FIG. 18A and/or at least one DVD may have the configuration shown in FIG. 18B. The HDD may be a mini HDD that includes one or more platters having a diameter that is smaller than approximately 1.8". Cellular phone 950 may be connected to memory 966 such as RAM, ROM, low latency nonvolatile memory such as flash memory and/or other suitable electronic data storage. Cellular phone 950 also may support connections with a WLAN via a WLAN network interface 968.

Figure 18F:
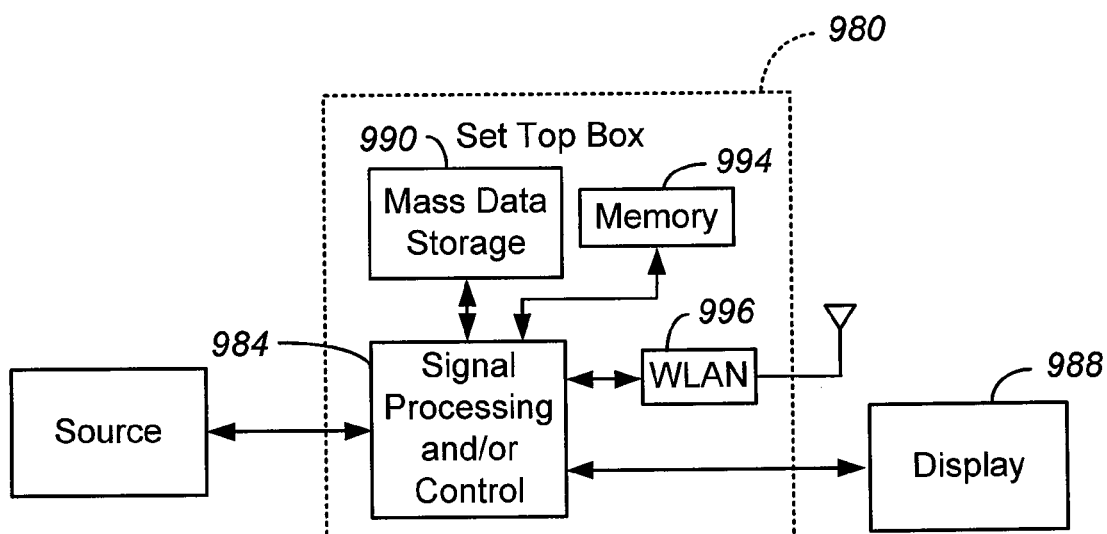

Referring now to FIG. 18F, the present invention may be embodied in a set top box 980. The present invention may implement either or both signal processing and/or control circuits, which are generally identified in FIG. 18F at 984, a WLAN interface and/or mass data storage of the set top box 980. Set top box 980 receives signals from a source such as a broadband source and outputs standard and/or high definition audio/video signals suitable for a display 988 such as a television and/or monitor and/or other video and/or audio output devices. Signal processing and/or control circuits 984 and/or other circuits (not shown) of the set top box 980 may process data, perform coding and/or encryption, perform calculations, format data and/or perform any other set top box function.

Set top box 480 may communicate with mass data storage 990 that stores data in a nonvolatile manner. Mass data storage 990 may include optical and/or magnetic storage devices for example hard disk drives HDD and/or DVDs. At least one HDD may have the configuration shown in FIG. 18A and/or at least one DVD may have the configuration shown in FIG. 18B. The HDD may be a mini HDD that includes one or more platters having a diameter that is smaller than approximately 1.8". Set top box 980 may be connected to memory 994 such as RAM, ROM, low latency nonvolatile memory such as flash memory and/or other suitable electronic data storage. Set top box 980 also may support connections with a WLAN via a WLAN network interface 996.

Figure 18G:
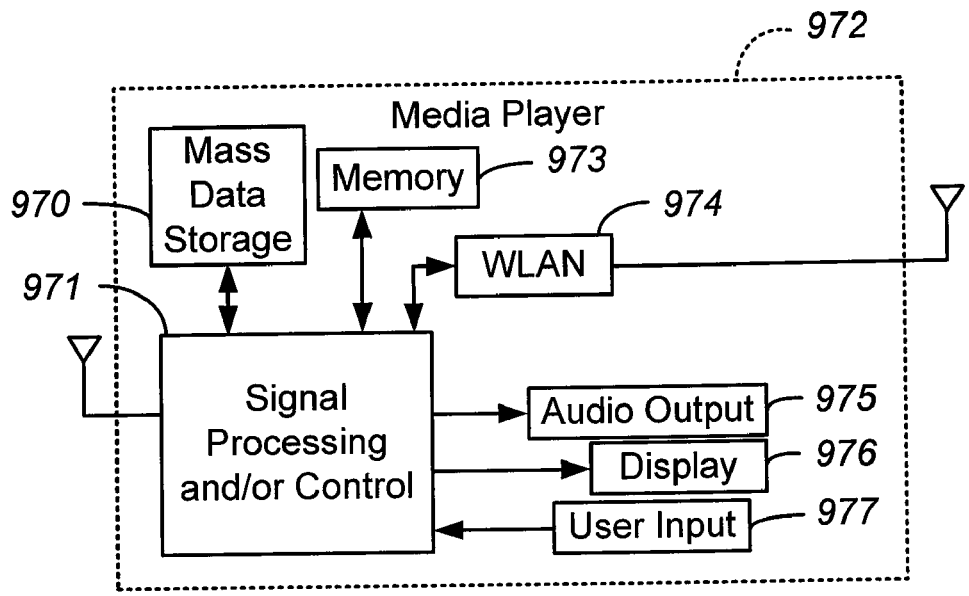

Referring now to FIG. 18G, the present invention may be embodied in a media player 972. The present invention may implement either or both signal processing and/or control circuits, which are generally identified in FIG. 18G at 971, a WLAN interface and/or mass data storage of the media player 972. In some implementations, media player 972 includes a display 976 and/or a user input 977 such as a keypad, touchpad and the like. In some implementations, media player 972 may employ a graphical user interface (GUI) that typically employs menus, drop down menus, icons and/or a point-and-click interface via display 976 and/or user input 977. Media player 972 further includes an audio output 975 such as a speaker and/or audio output jack. Signal processing and/or control circuits 971 and/or other circuits (not shown) of media player 972 may process data, perform coding and/or encryption, perform calculations, format data and/or perform any other media player function.

Media player 972 may communicate with mass data storage 970 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 18A and/or at least one DVD may have the configuration shown in FIG. 18B. The HDD may be a mini HDD that includes one or more platters having a diameter that is smaller than approximately 1.8". Media player 972 may be connected to memory 973 such as RAM, ROM, low latency nonvolatile memory such as flash memory and/or other suitable electronic data storage. Media player 972 also may support connections with a WLAN via a WLAN network interface 974.

Figure 18H:
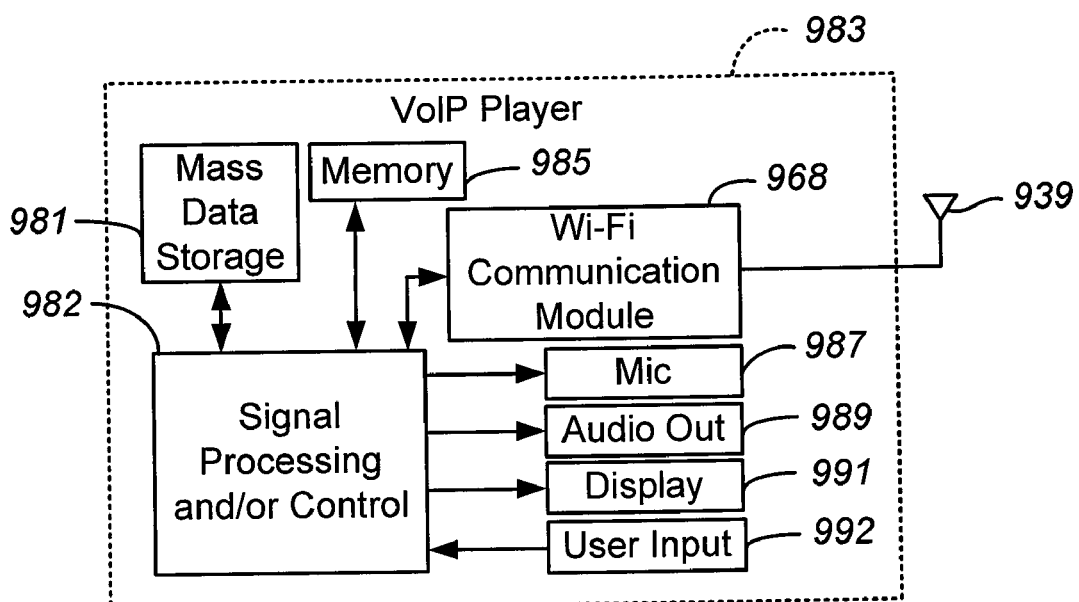

Referring to FIG. 18H, the present invention may be embodied in a Voice over Internet Protocol (VoIP) phone 983 that may include an antenna 939. The present invention may implement either or both signal processing and/or control circuits, which are generally identified in FIG. 18H at 982, a wireless interface and/or mass data storage of the VoIP phone 983. In some implementations, VoIP phone 983 includes, in part, a microphone 987, an audio output 989 such as a speaker and/or audio output jack, a display monitor 991, an input device 992 such as a keypad, pointing device, voice actuation and/or other input devices, and a Wireless Fidelity (Wi-Fi) communication module 986. Signal processing and/or control circuits 982 and/or other circuits (not shown) in VoIP phone 983 may process data, perform coding and/or encryption, perform calculations, format data and/or perform other VoIP phone functions.

VoIP phone 983 may communicate with mass data storage 502 that stores data in a nonvolatile manner such as optical and/or magnetic storage devices, for example hard disk drives HDD and/or DVDs. At least one HDD may have the configuration shown in FIG. 18A and/or at least one DVD may have the configuration shown in FIG. 18B. The HDD may be a mini HDD that includes one or more platters having a diameter that is smaller than approximately 1.8". VoIP phone 983 may be connected to memory 985, which may be a RAM, ROM, low latency nonvolatile memory such as flash memory and/or other suitable electronic data storage. VoIP phone 983 is configured to establish communications link with a VoIP network (not shown) via Wi-Fi communication module 986. Still other implementations in addition to those described above are contemplated. Although not explicitly shown, the present invention may also be disposed in various other portable electronic devices, such as MP3 players, personal digital assistants (PDA), notebook computers, etc.

The above embodiments of the present invention are illustrative and not limitative. Various alternatives and equivalents are possible. The invention is not limited by the type of integrated circuit in which the present disclosure may be disposed. Nor is the invention limited to any specific type of process technology, e.g., CMOS, Bipolar, or BICMOS that may be used to manufacture the present disclosure. Other additions, subtractions or modifications are obvious in view of the present disclosure and are intended to fall within the scope of the appended claims.

What is claimed is:

1. An amplifier, comprising:
    a control block adapted to generate first and second pulse-width modulated (PWM) control signals in response to a digital input signal;
    a signal generator adapted to generate a third signal in response to said first and second PWM control signals; and
    an integrator adapted to integrate the third signal in accordance with a feedback signal.

2. The amplifier of claim 1 wherein the control block further generates a third PWM signal that is delayed with respect to the first PWM signal and a fourth PWM signal that is delayed with respect to the second PWM signal, said amplifier further comprising:
    a comparator adapted to generate a comparison signal; and
    a switch logic adapted to receive the third and fourth PWM signals and the comparison signal and to generate first, second and third driver control signals.

3. The amplifier of claim 2 wherein said amplifier further comprises a driver adapted to receive the first, second and third driver control signals, said driver further comprising:
    a first transistor adapted to deliver a first voltage to an output node in response to the first driver control signal;
    a second transistor adapted to deliver a second voltage to the output node in response to the second driver control signal; and
    a third transistor adapted to deliver a third voltage to the output node in response to the third driver control signal, wherein said feedback signal is supplied by the output node.

4. The amplifier of claim 3 wherein said first voltage is a positive supply voltage, said second voltage is a negative supply voltage, and said third voltage is the ground voltage.

5. The amplifier of claim 1 wherein said signal generator comprises:
    a first voltage divider coupled between first and second supply voltages;

a first operational amplifier responsive to the first voltage divider;
a first switch adapted to deliver an output voltage of the first operational amplifier as the third signal in response to the first PWM signal;
a second voltage divider coupled between a third supply voltage and the second supply voltage;
a second operational amplifier responsive to the second voltage divider; and
a second switch adapted to deliver an output voltage of the second operational amplifier as the third signal in response to the second PWM signal.

6. The amplifier of claim 1 wherein said signal generator comprises:
a first current source supplying a first current;
a first switch adapted to deliver the first current as the third signal;
a second current source supplying a second current; and
a second switch adapted to deliver the second current as the third signal.

7. The amplifier of claim 1 wherein said control block comprises:
an upsampler adapted to upconvert a sampling rate of the digital input signal.

8. The amplifier of claim 7 wherein said control block further comprises:
a sampling point module adapted to identify cross sections of a sawtooth or a triangular signal with the upconverted digital input signal, said cross sections defining a first binary word; and
a noise shaper adapted to receive the first binary word and generate a second binary word having fewer bits than the first binary word.

9. The amplifier of claim 8, wherein said control block further comprises:
a pulse-width modulator adapted to generate the first, second, third and fourth PWM signals in accordance with the second binary word.

10. The amplifier of claim 9 wherein said pulse-width modulator further comprises circuitry adapted to increase a width of each of the first, second, third and fourth PWM signals by a minimum pulse width.

11. The amplifier of claim 10 wherein said pulse-width modulator further comprises circuitry adapted to subtract a pulse having the minimum pulse width from of each of the first, second, third and fourth PWM signals.

12. The amplifier of claim 9 wherein said pulse-width modulator further comprises circuitry adapted to increase a width of a pulse it generates by a minimum amount if the width of the pulse is less than a predefined value.

13. The amplifier of claim 12 wherein said pulse-width modulator further comprises circuitry adapted to subtract a pulse having the minimum pulse width from the pulse.

14. A method of amplifying a signal, the method comprising:
generating first and second pulse-width modulated (PWM) control signals in response to a digital input signal;
generating a third signal in response to said first and second PWM control signals; and
integrating the third signal in accordance with a feedback signal.

15. The method of claim 14 further comprising:
generating a comparison signal;
generating a third PWM signal that is delayed with respect to the first PWM signal;
generating a fourth PWM signal that is delayed with respect to the second PWM signal; and
generating first, second and third driver control signals in response to the third and fourth PWM signals and the comparison signal.

16. The method of claim 15 further comprising:
delivering a first voltage to an output node in response to the first driver control signal;
delivering a second voltage to the output node in response to the second driver control signal; and
delivering a third voltage to the output node in response to the third driver control signal.

17. The method of claim 16 wherein said first voltage is a positive supply voltage, said second voltage is a negative supply voltage and said third voltage is the ground voltage.

18. The method of claim 14 further comprising:
setting the third signal to a voltage defined by levels of first and second supply voltages in response to the first PWM signal; and
setting the third signal to a voltage defined by levels of a third supply voltage and the second supply voltage in response to the second PWM signal.

19. The method of claim 14 further comprising:
delivering a first current as the third signal in response to the first PWM signal; and
delivering a second current as the third signal in response to the second PWM signal.

20. The method of claim 14 further comprising:
upconverting a sampling rate of the digital input signal.

21. The method of claim 20 further comprising:
identifying cross sections of a sawtooth or a triangular signal with the upconverted digital input signal, said cross sections defining a first binary word; and
noise shaping the first binary word to generate a second binary word having fewer bits than the first binary word.

22. The method of claim 21 further comprising:
generating the first, second, third and fourth PWM signals in accordance with the second binary word.

23. The method of claim 22 further comprising:
increasing a width of one or more of the first, second, third and fourth PWM signal by a minimum pulse width if the width of the one or more of the first, second, third and fourth PWM signals is detected as being smaller than a predefined value.

24. The method of claim 23 further comprising:
subtracting a minimum pulse width from the one or more of the first, second, third and fourth PWM signals having increased widths.

25. The method of claim 22 further comprising:
increasing a width of the first, second, third and fourth PWM signals by a minimum pulse width.

26. The method of claim 25 further comprising:
subtracting the minimum pulse width from the first, second, third and fourth PWM signals having increased widths.

27. An amplifier, comprising:
a pulse-width modulator adapted to increase or decrease a width of a first pulse-width modulated control signal or a second pulse-width modulated control signal;
a signal generator adapted to generate a third signal in response to said first and second pulse width modulated control signals; and
an integrator adapted to integrate the third signal in accordance with a feedback signal.

28. The amplifier of claim 27, wherein said pulse-width modulator is adapted to increase the width of a pulse it generates if the width of the pulse is less than a predefined value.

* * * * *